United States Patent
Ishihara

(10) Patent No.: US 10,582,123 B2
(45) Date of Patent: Mar. 3, 2020

(54) IMAGING APPARATUS

(71) Applicant: CANON KABUSHIKI KAISHA, Tokyo (JP)

(72) Inventor: Keiichiro Ishihara, Ageo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/047,201

(22) Filed: Jul. 27, 2018

(65) Prior Publication Data

US 2019/0045115 A1    Feb. 7, 2019

(30) Foreign Application Priority Data

Aug. 1, 2017 (JP) ................... 2017-149462

(51) Int. Cl.
*H04N 5/232* (2006.01)
*H04N 9/04* (2006.01)
(Continued)

(52) U.S. Cl.
CPC ....... *H04N 5/23232* (2013.01); *G06T 3/4015* (2013.01); *G06T 3/4053* (2013.01);
(Continued)

(58) Field of Classification Search
CPC .......... H04N 5/23232; H04N 5/3696; H04N 5/2254; H04N 9/0455; G06T 5/003; G06T 5/50; G06T 3/4015; G06T 3/4053; H01L 27/14621; H01L 27/14618; H01L 2237/1205; H01L 27/14627; B01J 2219/00448
See application file for complete search history.

(56) References Cited

U.S. PATENT DOCUMENTS

| 8,902,321 | B2 | 12/2014 | Venkataraman et al. |
| 2009/0190022 | A1* | 7/2009 | Ichimura ............ G02B 3/0056 348/340 |
| 2014/0203331 | A1* | 7/2014 | Tanaka ............ H01L 27/14621 257/231 |

FOREIGN PATENT DOCUMENTS

| JP | 2006-186512 A | 7/2006 |
| JP | 2011-523538 A | 8/2011 |
| WO | 2009/151903 A2 | 12/2009 |

OTHER PUBLICATIONS

Henrique S. Malvar, Li-wei He, and Ross Cutler. "High-quality linear interpolation for demosaicing of Bayer-patterned color images." Acoustics, Speech, and Signal Processing, 2004. Proceedings, (ICASSP'04). IEEE International Conference. vol. 3 IEEE, 2004.

* cited by examiner

*Primary Examiner* — Yogesh K Aggarwal
(74) *Attorney, Agent, or Firm* — Venable LLP

(57) ABSTRACT

An imaging apparatus includes a plurality of imaging optical systems, and an imaging device having a plurality of imaging regions, each corresponding to one of the plurality of imaging optical systems. The plurality of imaging optical systems are arranged such that $(2M+1)\times(2N+1)$ imaging optical systems are arranged two-dimensionally in a horizontal direction and a vertical direction, where M and N are integers of 1 or more. A difference between a shift amount of the reference imaging optical system and a shift amount of an imaging optical system other than the reference imaging optical system is $2\times Km/(2M+1)$ pixels in a horizontal direction and $2\times Kn/(2N+1)$ pixels in a vertical direction, where Km is an integer satisfying $-M \leq Km \leq M$, and Kn is an integer satisfying $-N \leq Kn \leq N$.

21 Claims, 16 Drawing Sheets

(51) Int. Cl.
  *G06T 3/40*   (2006.01)
  *G06T 5/00*   (2006.01)
  *G06T 5/50*   (2006.01)
  *H04N 5/225*   (2006.01)
  *H04N 5/369*   (2011.01)
  *H01L 27/146*   (2006.01)
  *H04N 5/349*   (2011.01)
(52) U.S. Cl.
  CPC ............... *G06T 5/003* (2013.01); *G06T 5/50* (2013.01); *H04N 5/2254* (2013.01); *H04N 5/3696* (2013.01); *H04N 9/0455* (2018.08); *H04N 9/04557* (2018.08); *H01L 27/14618* (2013.01); *H01L 27/14621* (2013.01); *H04N 5/349* (2013.01)

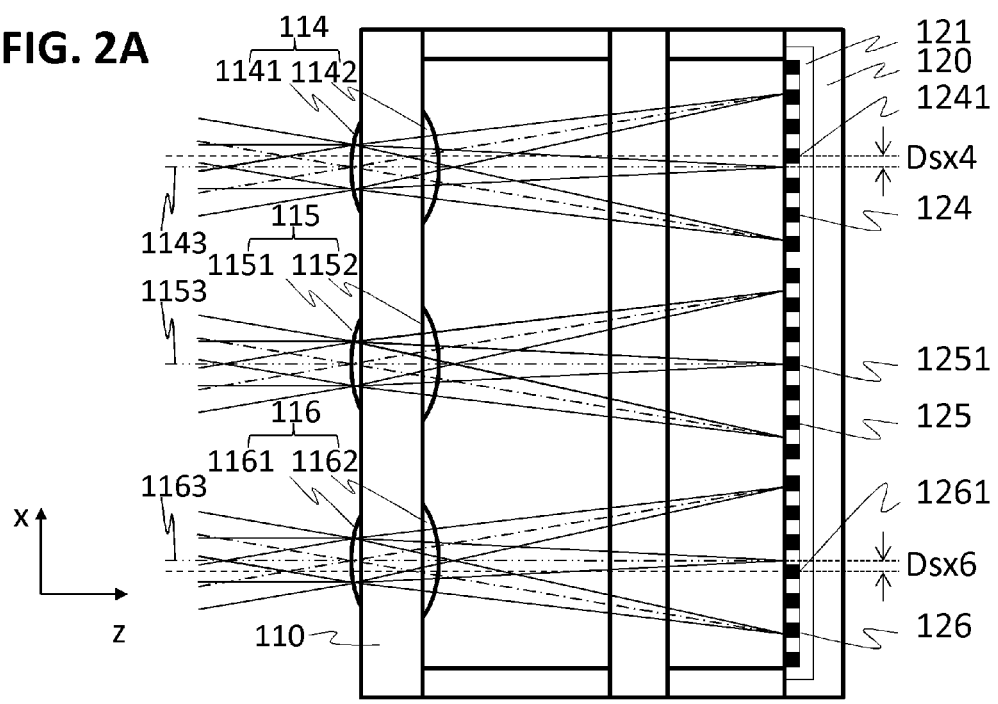
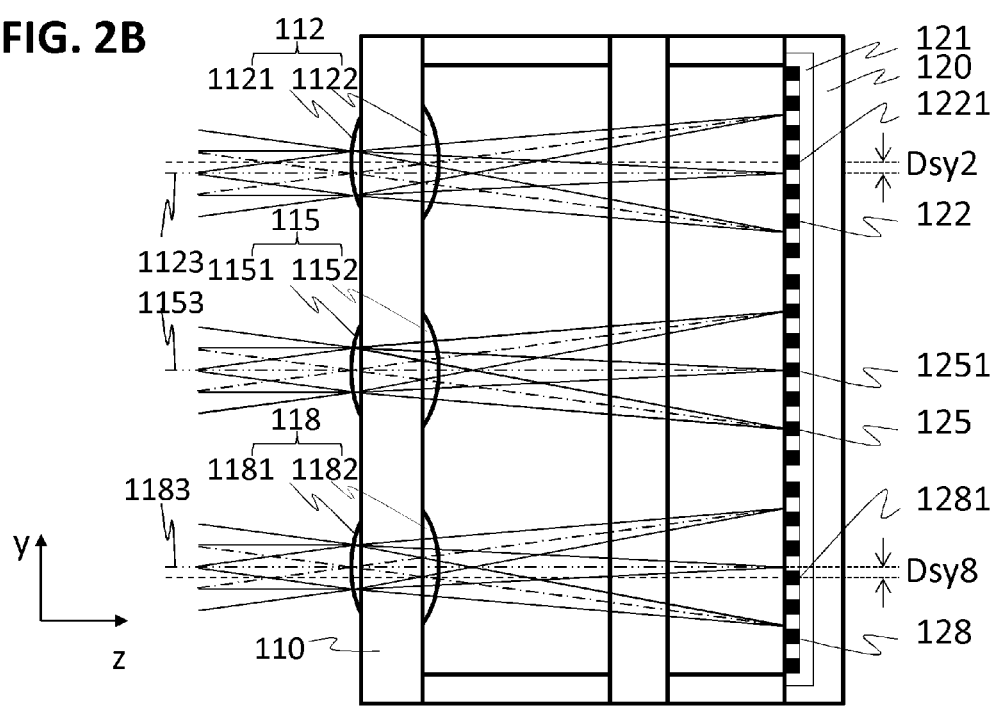

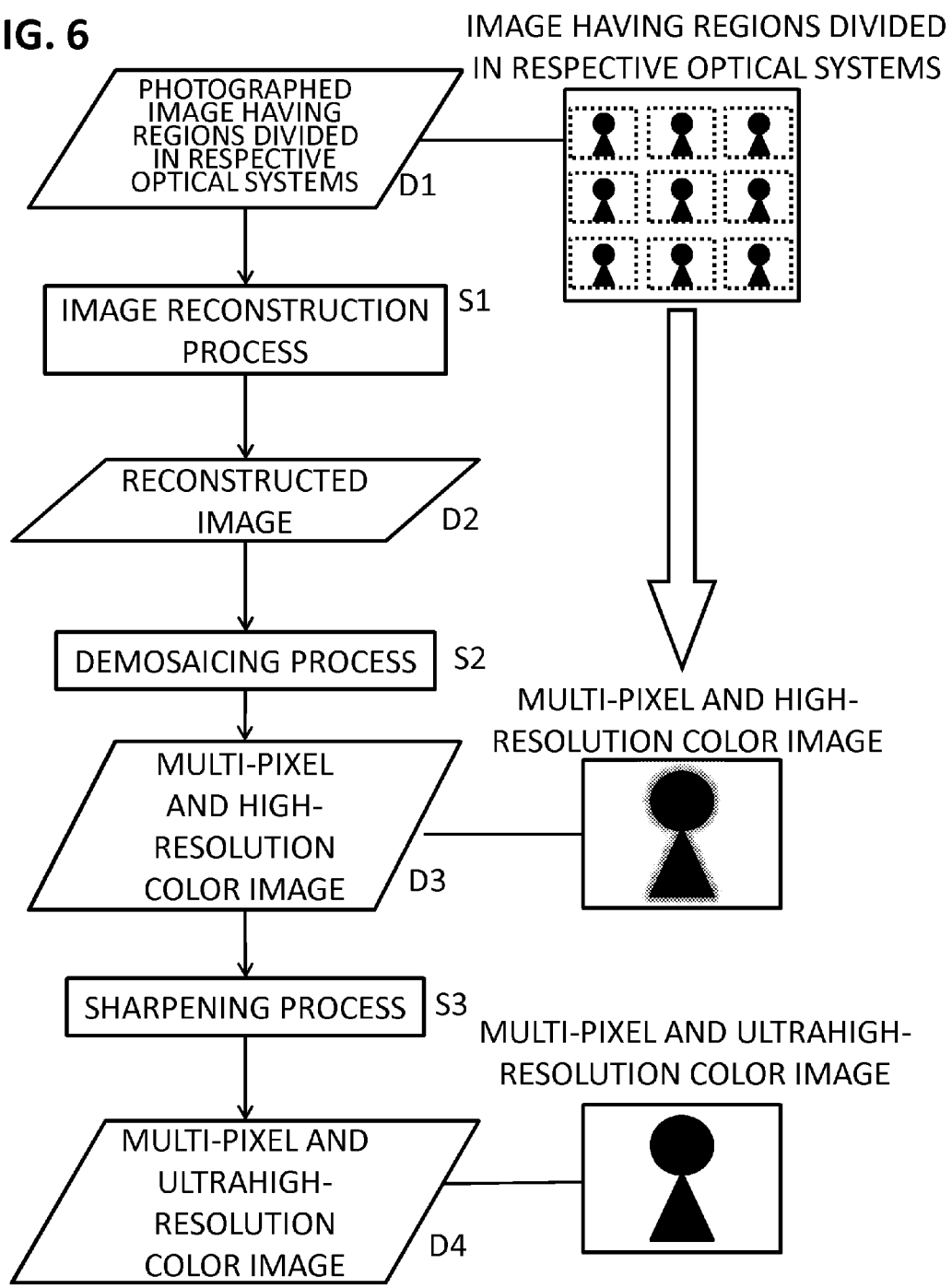

FIG. 7A

| -1 | -1 | -1 |
|---|---|---|
| -1 | 9 | -1 |
| -1 | -1 | -1 |

$\times \dfrac{1}{9}$

FIG. 7B

| -bk | -ak | -bk |
|---|---|---|
| -ak | 4(a+b)k+1 | -ak |
| -bk | -ak | -bk |

$\times \dfrac{1}{9}$

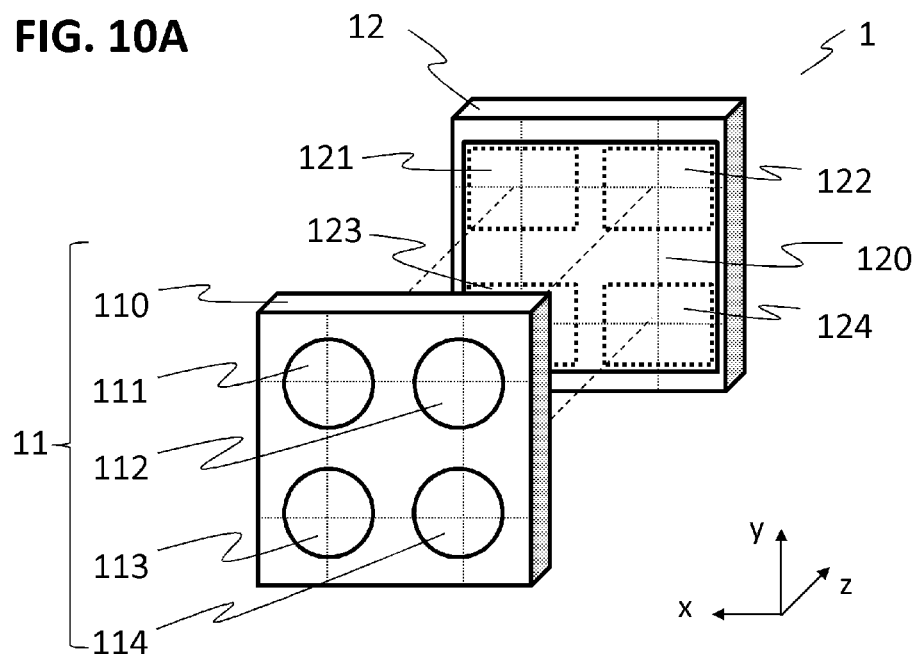
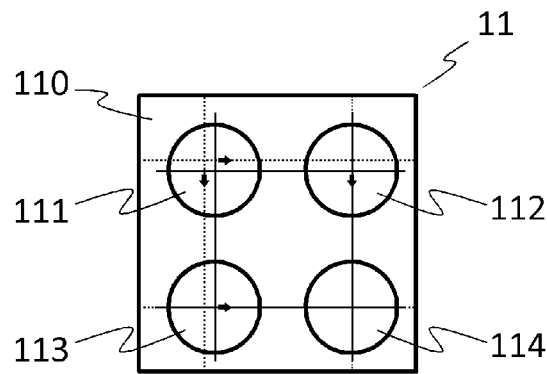
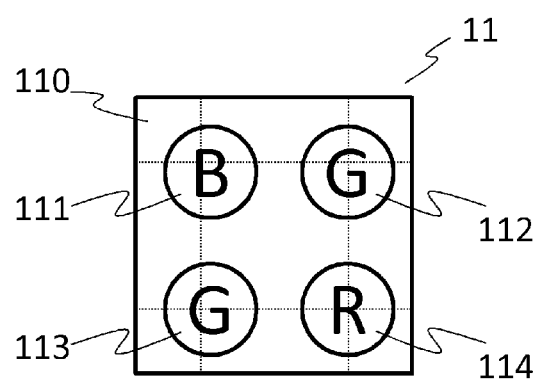

FIG. 15A

| R | G |
|---|---|
| G | B |

FIG. 15B

| R |   | G |   |
|---|---|---|---|
|   |   |   |   |
| G |   | B |   |
|   |   |   |   |

FIG. 15C

| R | R | G | G |
|---|---|---|---|
| R | R | G | G |
| G | G | B | B |
| G | G | B | B |

IMAGING APPARATUS

BACKGROUND OF THE INVENTION

Field of the Invention

The present invention relates to an imaging apparatus, and more particularly, to a technique of improving resolution by a pixel shift.

Description of the Related Art

A well-known technique called a "pixel shift" is known as a super-resolution method for improving the resolution of an imaging device. A pixel shift is a method of photographing a plurality of images obtained by shifting imaging devices in a predetermined direction in a time-series order and generating a multi-pixel and high-resolution image from the plurality of photographed images.

Japanese Patent Application Publication No. 2006-186512 discloses a color imaging apparatus which realizes a pseudo-high resolution by a pixel shift and in which a shift amount is optimized according to a wavelength region. Color filters that transmit light of different wavelengths and parallel flat plate-shaped transparent members are arranged on optical axes of a plurality of optical systems and an inclination angle of the transparent members with respect to the optical axis is different depending on a transmission wavelength region of the color filter to realize a pixel shift.

Japanese Patent Application Publication No. 2011-523538 discloses an imaging apparatus that captures an image using a plurality of imaging apparatuses fabricated on a substrate. The plurality of imaging apparatuses include at least a first imaging apparatus formed on a first position on the substrate and a second imaging apparatus formed on a second position on the substrate, and the second imaging apparatus captures an image which is shifted by a subpixel phase from the image captured by the first imaging apparatus. The images from the first and second imaging apparatuses are combined using super-resolution processing in order to obtain a high-resolution image.

However, the imaging apparatus of Japanese Patent Application Publication No. 2006-186512 equalizes the shift amounts in respective wavelength regions. In the case of imaging devices of the Bayer arrangement, uneven pseudo-high resolution is achieved for the pixels of respective wavelength regions and it is not possible to obtain a high-quality image. For example, a case in which pseudo-high resolution is achieved for the RGGB Bayer arrangement illustrated in FIG. 15A will be discussed as an example. The arrangement of pixels is illustrated in FIG. 15B. When a pixel shift is performed by providing a shift amount of ½ pixel to a horizontal direction and a vertical direction and a shift amount of √2/2 pixel to a diagonal direction, the following problems occur. That is, uneven pseudo-high resolution is realized such that pixels of the same wavelength region are placed close to each other as illustrated in FIG. 15C, and it is not possible to obtain a high-quality image. Moreover, it is necessary to set the angle of the parallel flat plate-shaped transparent members in a time-series order in order to perform a pixel shift in the horizontal direction, the vertical direction, and the diagonal direction. Therefore, it is not possible to cope with a moving subject and a moving image.

Japanese Patent Application Publication No. 2011-523538 provides a parallax between the first and second imaging apparatuses placed at different positions on the substrate to provide an offset of a subpixel to a photographed image. However, a phase difference is not provided to respective imaging optical systems with respect to the pixels of an imaging device. Since the imaging apparatus of Japanese Patent Application Publication No. 2011-523538 has a large parallax, the arrangement of pixels in the respective imaging apparatuses changes according to a photographing distance. It cannot be said that the subjects photographed in the effective regions of imaging devices are at the same distance. Due to this, in order to perform super-resolution processing, it is necessary to first detect the parallax in respective pixels of respective imaging apparatuses and then to rearrange the pixels on the basis of the parallax of the respective pixels. Detecting the parallax of respective pixels incurs a large amount of computation and takes a long computation time and the accuracy of the detected parallax is low and it is difficult to generate a high-resolution image.

As explained, there is no known technique for acquiring a high-resolution reconstructed image from a plurality of photographed images with a moving subject and a moving image.

SUMMARY OF THE INVENTION

An object of the present invention is to provide a technique for allowing an imaging apparatus acquiring a high-resolution reconstructed image from a plurality of photographed images to cope with a moving subject and a moving image.

In order to attain the object, an imaging apparatus according to an aspect of the present invention includes: a plurality of imaging optical systems arranged two-dimensionally; and an imaging device having a plurality of imaging regions each including a plurality of pixels, each of the imaging regions corresponding to one of the plurality of imaging optical systems, wherein at least a part of the plurality of imaging optical systems are arranged shifted with respect to a center of the corresponding imaging region by a shift amount different from that of another one of the plurality of imaging optical systems.

According to the aspect of the present invention, an imaging apparatus is provided, which is capable of acquiring high-resolution images even when the image contains a moving subject or is a moving image.

Further features of the present invention will become apparent from the following description of exemplary embodiments with reference to the attached drawings.

BRIEF DESCRIPTION OF THE DRAWINGS

FIGS. 2A and 2B are cross-sectional views of an imaging optical system and an imaging device according to Embodiment 1;

FIGS. 4A to 4G are diagrams for describing an imaging range (a covering angle of view) of each pixel and a reconstruction process according to Embodiment 1;

FIG. 6 is a flowchart of an image processing flow of the image processing apparatus according to Embodiment 1;

FIGS. 7A and 7B are diagrams for describing a sharpening filter according to Embodiment 1;

FIGS. 9A to 9K are diagrams for describing an imaging range or each pixel and a reconstruction process according to Embodiment 2;

FIGS. 10A to 10C are diagrams schematically illustrating a configuration of an imaging apparatus according to Embodiment 4;

FIGS. 15A to 15C are diagrams for describing a pixel shift according to a related art.

DESCRIPTION OF THE EMBODIMENTS

Embodiment 1

(Overall Configuration)

Figure 1:
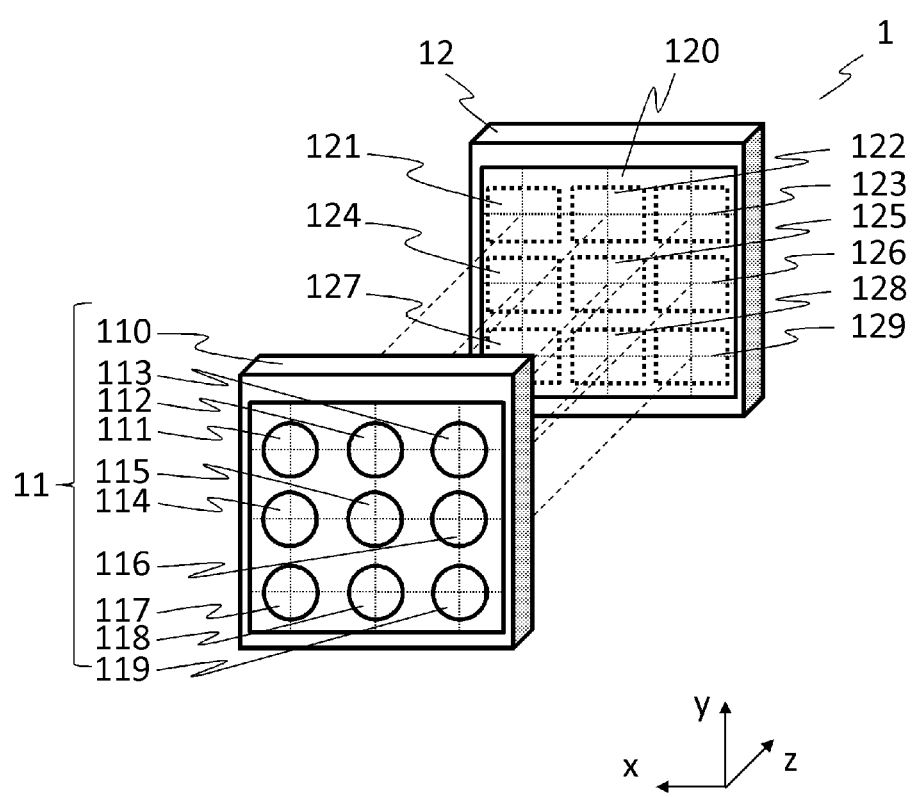
FIG. 1 is a diagram schematically illustrating a configuration of an imaging apparatus according to Embodiment 1.

An imaging apparatus according to Embodiment 1 of the present invention will be described. FIG. 1 is a diagram schematically illustrating an imaging apparatus according to the present embodiment. An imaging apparatus 1 includes a lens unit 11 in which a plurality of imaging optical systems are arranged two-dimensionally and a sensor unit 12.

The lens unit 11 is made up of a plurality of imaging optical systems, and in the present embodiment, is formed such that nine imaging optical systems 111 to 119 made up of three imaging optical systems in a horizontal direction and three imaging optical systems in a vertical direction (hereinafter referred to as a 3×3 arrangement) are integrated with a lens board 110. Such a lens unit 11 can be manufactured, for example, by machining a lens surface directly on a crystal substrate by a lithography process or forming a lens surface on a lens board by a molding technique such as a replica technique.

The sensor unit 12 has nine imaging regions 121 to 129 arranged in a two-dimensional 3×3 arrangement corresponding to the imaging optical systems 111 to 119, provided in an effective portion of the imaging device 120. Each of the imaging regions 121 to 129 has color filters of the Bayer arrangement. The images formed by the imaging optical systems 111 to 119 are formed on the imaging regions 121 to 129, respectively, and are imaged by the imaging device 120.

Here, an imaging system formed by the imaging optical system 111 and the imaging region 121 on the imaging device 120 is referred to as a first monocular imaging system. Similarly, the imaging systems formed by the imaging optical systems 112 to 119 and the corresponding imaging regions 122 to 129 are referred to as second to ninth monocular imaging systems, respectively.

(Arrangement of Imaging Optical System and Imaging Device)

FIG. 2A illustrates a horizontal cross-sectional view of the imaging apparatus 1 according to the present embodiment and FIG. 2B illustrates a vertical cross-sectional view thereof.

FIG. 2A illustrates a horizontal cross-section including the optical axes of the fourth, fifth, and sixth imaging optical systems 114, 115, and 116 of the lens unit 11 illustrated in FIG. 1. The fourth imaging optical system 114 is an imaging optical system made up of two lenses 1141 and 1142 formed on both surfaces of the lens board 110. Similarly, the fifth imaging optical system 115 is an imaging optical system made up of two lenses 1151 and 1152 formed on both surfaces of the lens board 110. Similarly, the sixth imaging optical systems 116 is an imaging optical system made up of two lenses 1161 and 1162 formed on both surfaces of the lens board 110. The first to third and seventh to ninth imaging optical systems (not illustrated) have a similar configuration. In the present embodiment, the first lenses 1111 to 1191 used in the respective imaging optical systems 111 to 119 have the same shape and the second lenses 1112 to 1192 have the same shape. Due to this, it is possible to straighten optical characteristics such as a maximum angle of view, distortion, and a curvature of image a surface of an imaging optical system to straighten the pitches of angles of view covered by the respective pixels. This provides an advantage that it is easy to set different angles of view (covering imaging ranges) to respective pixels of all imaging regions to be described later.

FIG. 2A illustrates imaging regions 124, 125, and 126 corresponding to the fourth, fifth, and sixth imaging optical systems 114, 115, and 116 within the imaging device 120 of the sensor unit 12 illustrated in FIG. 1. In FIG. 2A, the pixels in the imaging regions 124, 125, and 126 are represented schematically. In the present embodiment, although 640 pixels in a horizontal direction and 480 pixels in a vertical direction are included in each of the imaging regions 124, 125, and 126, a smaller number of pixels than the actual number of pixels are illustrated since one pixel is represented in a large size in FIG. 2A.

FIG. 2B illustrates a vertical cross-section including the optical axes of the second, fifth, and eighth imaging optical systems 112, 115, and 118 in the lens unit 11 illustrated in FIG. 1. FIG. 2B also illustrates the imaging regions 122, 125, and 128 corresponding to the second, fifth, and eighth imaging optical systems 112, 115, and 118 within the imaging device 120 of the sensor unit 12 illustrated in FIG. 1. In FIG. 2B, the pixels in the imaging regions 122, 125, and 128 are represented schematically.

Here, a configuration in which different angles of view (covering imaging ranges) are set to respective pixels of all imaging regions will be described with reference to FIGS. 2A, 2B, and 3A.

The fifth imaging optical system 115 has an optical axis 1153 disposed at the center of a pixel 1251 located near the center of the imaging region 125. In contrast, the fourth imaging optical system 114 has an optical axis 1143 disposed at a position shifted by a shift amount of $D_{sx4}=-\frac{2}{3}$ pixel from the center of a pixel 1241 located near the center of the imaging region 124. Moreover, the sixth imaging optical system 116 has an optical axis 1163 disposed at a position shifted by a shift amount of $D_{sx6}=+\frac{2}{3}$ pixel from the center of a pixel 1261 located near the center of the imaging region 126. A pixel pitch of the imaging device 120 of the present embodiment is $P_p=1.1$ μm. Therefore, an actual shift amount in the horizontal direction of the fourth imaging optical system 114 is $D_{sx4}=-0.73$ μm and an actual shift amount in the horizontal direction of the sixth imaging optical system 116 is $D_{sx6}=+0.73$ μm. The upper side of the drawing sheet of FIG. 2A is a plus side and the lower side is a minus side.

Here, a "shift" will be described further. When an optical axis of an imaging optical system is identical to the center of a specific pixel (a reference pixel) in an imaging region corresponding to the imaging optical system, this imaging optical system is expressed as not being shifted. When the optical axis of the imaging optical system is shifted from the center of the reference pixel, this imaging optical system is expressed as being shifted. A shift amount is a vector amount which is defined in a plane vertical to the optical axis and has a direction and a magnitude. Moreover, arranging an optical axis of an imaging optical system to be shifted from the center of a reference pixel is expressed as shifting the imaging optical system or arranging the same to be shifted. The reference pixel is a pixel positioned at a specific position (typically the center or a vicinity thereof) in an imaging region. In the present disclosure, a relative shift amount between two imaging optical systems or a difference in shift amount is sometimes considered. As is obvious from the definition of a shift amount, a relative shift amount or a difference in shift amount is also a vector amount.

An arrangement of an imaging optical system can be specified using a phase with respect to a pixel pitch of an imaging device. Two imaging optical systems being arranged at the same phase means that the two imaging optical systems are arranged in a state in which the optical axes thereof are separated by the same amount from the centers of the corresponding reference pixels. Moreover, two imaging optical systems being arranged at different phases means that the two imaging optical systems are arranged in a state in which the optical axes thereof are separated by different amounts from the centers of the corresponding reference pixels.

In the present embodiment, the fourth and sixth imaging optical systems 114 and 116 are shifted in a direction closer to the fifth imaging optical system 115 disposed at the center. If the shift amounts of the respective imaging optical systems from a reference imaging optical system are different, a sufficient advantage can be obtained. Due to this, the respective imaging optical systems may be shifted in a direction away from each other even if the imaging optical systems are shifted in a direction away from the reference imaging optical system.

In the vertical direction, the fifth imaging optical system 115 has an optical axis 1153 disposed at the center of a pixel 1251 located near the center of the imaging region 125. The second imaging optical system 112 has an optical axis 1123 disposed at a position shifted by a shift amount of $D_{sy2}=-\frac{2}{3}$ pixel from the center of a pixel 1221 located near the center of the imaging region 122. Moreover, the eighth imaging optical system has an optical axis 1183 disposed at a position shifted by a shift amount of $D_{sy8}=+\frac{2}{3}$ pixel from the center of a pixel 1281 located near the center of the imaging region 128.

A pixel pitch in the vertical direction of the imaging device 120 is $P_p=1.1$ μm. Therefore, an actual shift amount in the vertical direction of the second imaging optical system 112 is $D_{sy2}=-0.73$ μm and an actual shift amount in the vertical direction of the eighth imaging optical system 118 is $D_{sy8}=+0.73$ μm. The upper side of the drawing sheet of FIG. 2B is a plus side and the lower side is a minus side. The second and eighth imaging optical systems 112 and 118 are shifted in a direction closer to the fifth imaging optical system 115 disposed at the center.

In a pixel shift according to the related art, imaging devices are shifted in units of subpixels in time-series order to acquire a plurality of images. In contrast, in the present embodiment, respective imaging optical systems have different shift amounts so that a plurality of images are acquired simultaneously. In the present embodiment, since a plurality of images are acquired in a shot, the present embodiment can be applied when a quickly moving subject is photographed or a moving image is photographed. In the present embodiment, the angle of view applied to each pixel is constant regardless of a photographing distance (the distance from an imaging optical system to a subject). Due to this, a pixel arrangement of a reconstructed image can be made constant regardless of a photographing distance. The influence of parallax occurs when respective imaging optical systems are arranged at different positions and a physical gap is present between the respective imaging optical systems. Due to the presence of parallax, a pixel arrangement of a reconstructed image changes depending on a photographing distance. However, in the imaging apparatus according to the present embodiment, since the gap between respective imaging optical systems is set as narrow as approximately 1 mm, the imaging apparatus is rarely affected from parallax. In this way, in the imaging apparatus according to the present embodiment, a satisfactory quality of a reconstructed image is obtained regardless of a photographing distance. Moreover, by shifting respective imaging optical systems in a direction closer to a reference imaging optical system, it is possible to alleviate the influence of parallax as much as possible.

Figure 3A:
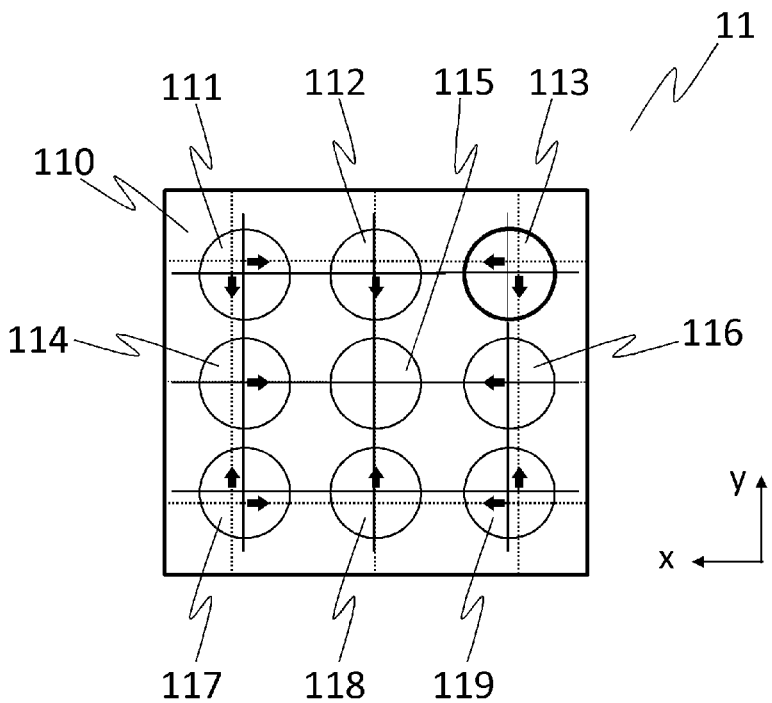
FIGS. 3A to 3C are diagrams for describing a shift of an imaging optical system according to Embodiment 1 and an imaging range of a pixel.

FIG. 3A illustrates a shift of respective imaging optical systems in a lens unit of the imaging apparatus according to the present embodiment. The shift amounts of respective imaging optical systems (OSs) are illustrated in Table 1.

TABLE 1

SHIFT AMOUNTS OF OPTICAL SYSTEMS (OS)

| FIRST OS 111 | SECOND OS 112 | THIRD OS 113 |
|---|---|---|
| D s x 1 = -⅔ PX | D s x 2 = 0 PX | D s x 3 = +⅔ PX |
| D s y 1 = -⅔ PX | D s y 2 = -⅔ PX | D s y 3 = -⅔ PX |
| FORTH OS 114 | FIFTH OS 115 | SIXTH OS 116 |
| D s x 4 = -⅔ PX | D s x 5 = 0 PX | D s x 6 = +⅔ PX |
| D s y 4 = 0 PX | D s y 5 = 0 PX | D s y 6 = 0 PX |
| SEVENTH OS 117 | EIGHTH OS 118 | NINTH OS 119 |
| D s x 7 = -⅔ PX | D s x 8 = 0 PX | D s x 9 = +⅔ PX |
| D s y 7 = +⅔ PX | D s y 8 = +⅔ PX | D s y 9 = +⅔ PX |

In the lens unit 11 in FIG. 3A, the imaging optical systems 111 to 119 are arranged on the lens board 110 in a 3×3 arrangement. The intersections of dotted lines in FIG. 3A indicate the positions of optical axes when the imaging optical systems 111 to 119 are arranged in a non-shifted state, and the intersections of solid lines indicate the positions of the optical axes of the respective imaging optical systems after shifting. Moreover, arrows in FIG. 3A indicate the shift directions of the respective imaging optical systems.

In the imaging apparatus of the present embodiment, the fifth imaging optical system 115 is disposed at the center of the 3×3 arrangement, and the fifth imaging optical system 115 is disposed without a shift (a shift amount is zero)—the optical axis of the imaging optical system is disposed at the center of a pixel. In the present embodiment, the fifth imaging optical system 115 at the center of the 3×3 arrangement is used as a reference imaging optical system. As described in FIG. 2A, the fourth and sixth imaging optical systems 114 and 116 are shifted in the horizontal direction only and are shifted in a direction closer to the reference imaging optical system 115. As described in FIG. 2B, the second and eighth imaging optical systems 112 and 118 are shifted in the vertical direction only and are shifted in a direction closer to the reference imaging optical system 115.

The remaining four imaging optical systems 111, 113, 117, and 119 are shifted in both the horizontal direction and vertical direction and are shifted in a direction closer to the reference imaging optical system 115.

In the first imaging optical system 111, the shift amount in the horizontal direction is set to $D_{sx1}=-\frac{2}{3}$ pixel and the shift amount in the vertical direction is set to $D_{sy1}=-\frac{2}{3}$ pixel. In the third imaging optical system 113, the shift amount in the horizontal direction is set to $D_{sx3}=+\frac{2}{3}$ pixel and the shift amount in the vertical direction is set to $D_{sy3}=-\frac{2}{3}$ pixel. In the seventh imaging optical system 117, the shift amount in the horizontal direction is set to $D_{sx7}=-\frac{2}{3}$ pixel and the shift amount in the vertical direction is set to $D_{sy7}=+\frac{2}{3}$ pixel. In the ninth imaging optical system 119, the shift amount in the horizontal direction is $D_{sx9}=+\frac{2}{3}$ pixel and the shift amount in the vertical direction is set to $D_{sy9}=+\frac{2}{3}$ pixel. In the imaging apparatus of the present embodiment, all imaging optical systems 111 to 119 have different shift amounts for the pixels of the imaging device. In this manner, by providing different shift amounts to the plurality of imaging optical systems arranged two-dimensionally, different angles of view (covering imaging regions) can be set to respective pixels of all imaging regions.

In the imaging apparatus of the present embodiment, different shift amounts are provided to the plurality of imaging optical systems arranged in a 3×3 two-dimensional arrangement, and the shift amount in the horizontal direction and the vertical direction is set to any one of 0 pixel, $+\frac{2}{3}$ pixel, and $-\frac{2}{3}$ pixel. In this way, different angles of view (imaging regions) are set to respective pixels of all imaging regions. In the present embodiment, although the component of the shift amount in the horizontal direction and the vertical direction is set to any one of 0 pixel, $+\frac{2}{3}$ pixel, and $-\frac{2}{3}$ pixel, the shift amount is not limited thereto, the components of the shift amounts of the respective imaging optical systems with respect to the reference imaging optical system may be 0 pixel, $+\frac{2}{3}$ pixel, and $-\frac{2}{3}$ pixel. Therefore, it is not necessary to dispose the optical axis of any one of the imaging optical systems at the center of a pixel, and it is sufficient that a relative shift amount with respect to the reference imaging optical system is set as described above. In other words, when a reference imaging optical system is shifted by (Dx pixel, Dy pixel) from the center of a reference pixel of the corresponding imaging region, the other reference imaging optical systems may be disposed so as to be shifted by (Dx+2i/3 pixel, Dy+2j/3 pixel). Here, i is any one of −1, 0, and +1 and j is any one of −1, 0, and +1 (excluding i=j=0) and the combination of i and j is different in respective imaging optical systems.

The color filters provided in the respective pixels of the respective imaging regions of the imaging device are arranged in the Bayer arrangement.

With this configuration, the respective pixels in the plurality of imaging regions can cover different imaging ranges. Moreover, the color filters included in the respective pixels when all pixels of a plurality of imaging regions are rearranged in order of photographing ranges can be arranged in the Bayer arrangement.

Figure 3B:
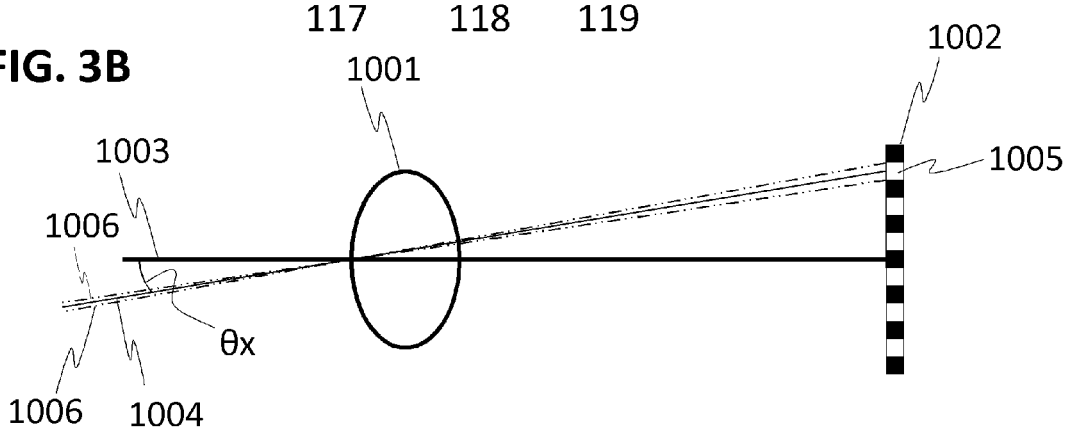
Figure 3C:
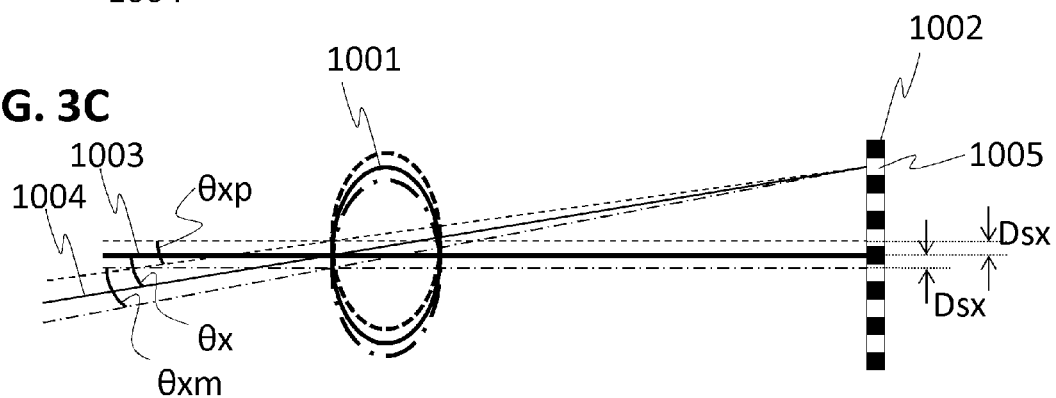

FIG. 3B is a diagram for describing a photographing range set to a pixel and FIG. 3C is a diagram for describing the relationship between a shift and a photographing range of an imaging optical system.

In FIG. 3B, a reference numeral 1001 indicates an imaging optical system, a reference numeral 1002 indicates an imaging device, and a reference numeral 1003 indicates an optical axis of the imaging optical system. A solid line 1004 indicates a principal ray of a beam of light formed at the center of a pixel 1005 of the imaging device 1002, and an angle between the principal ray 1004 and the optical axis 1003 is a central angle of view ex set to the pixel 1005. A two-dot chain line 1006 indicates principal rays of a beam of light formed at the ends of the pixel 1005 and the principal rays are present at upper and lower ends and have different angles. The angle of view (a photographing range) set to the pixel 1005 is a range of angles of view at both ends of a pixel about the angle of view $\theta_x$, and in this example, these angles of view will be referred to as the angle of view $\theta_x$ as a representative angle of view.

Reference numerals 1001 to 1005 in FIG. 3C are the same as those of FIG. 3B. A solid line indicates a state in which an imaging optical system is not shifted, a dotted line indicates a state in which an imaging optical system is shifted by $+D_{sx}$, and a one-dot chain line indicates a state in which an imaging optical system is shifted by $-D_{sx}$. The angle of view of the pixel 1005 is $\theta_x$ in a state (the solid line) in which the imaging optical system is not shifted. In contrast, the angle of view changes to $\theta_{xp}$ in a state (the dotted line) in which an imaging optical system is shifted by $+D_{sx}$ and the angle of view changes to $\theta_{xm}$ in a state (the one-dot chain line) in which an imaging optical system is shifted by $-D_{sx}$. A change in the angle of view is $\theta_x-\theta_{xp}$ for the former case and is $\theta_x-\theta_{xm}$ for the latter case. By shifting the plurality of imaging optical systems by appropriate amounts using these values, desired different angles of view (imaging ranges) can be set to the respective pixels of all imaging regions.

(Reconstruction Method)

Next, a method of reconstructing a multi-pixel and high-resolution image from monocular images acquired by monocular imaging systems will be described with reference to FIGS. 4A to 4G.

Figures 4A, 4B, 4C, 4D, 4E, 4F, 4G:
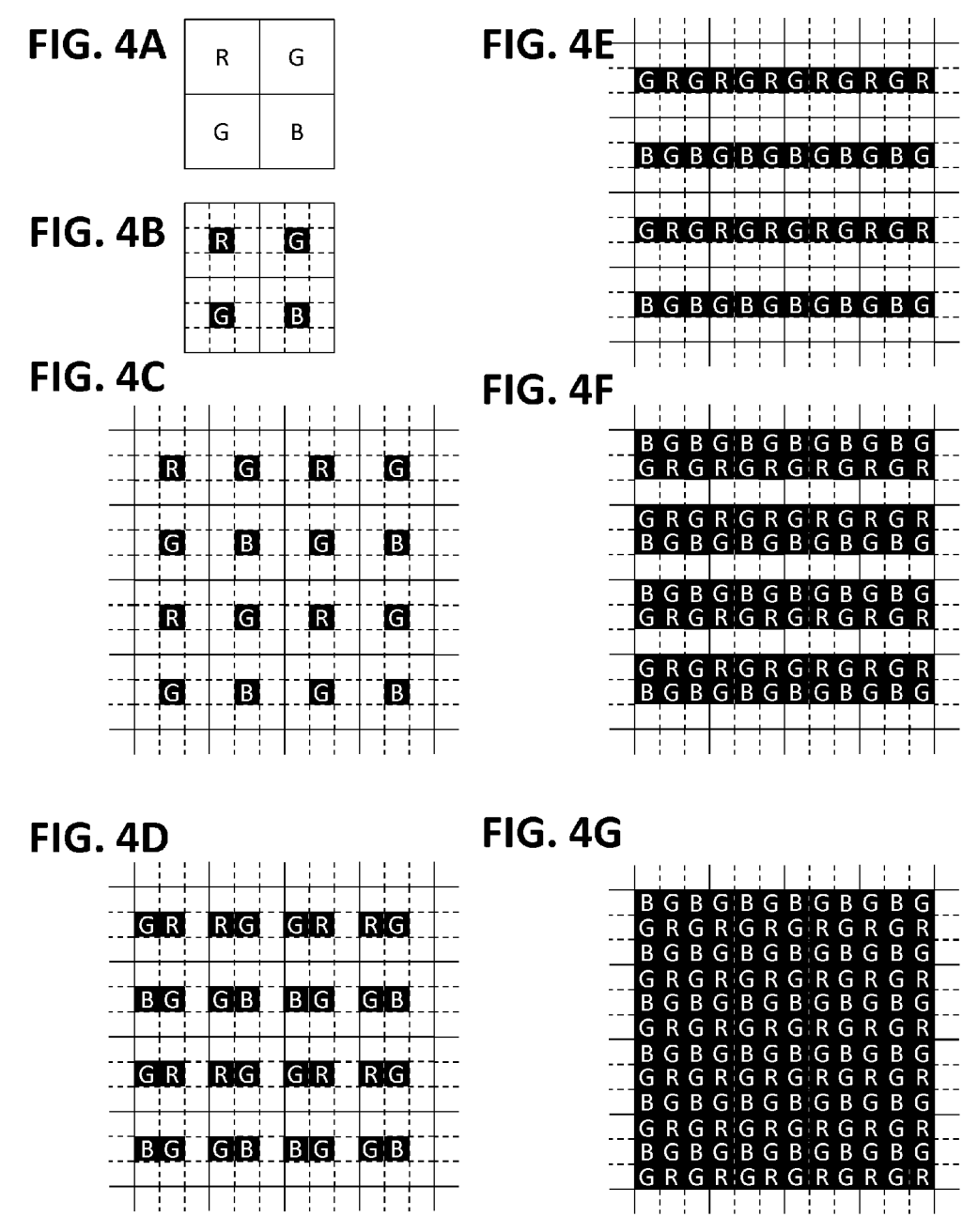

FIG. 4A is a diagram for describing a RGGB Bayer arrangement. Color filters of three channels of red (R), green (G), and blue (B) are arranged in the Bayer arrangement in the respective pixels of the imaging device 120 of the present embodiment. The imaging regions 121 to 129 are similarly arranged in the RGGB Bayer arrangement illustrated in FIG. 4A.

FIG. 4B illustrates an angle of view covered by each pixel of FIG. 4A. As illustrated in FIG. 4B, one pixel covers an angle of view from one end of the pixel to the other end, and the angle of view at the center of the pixel is referred to as the central angle of view of the pixel of interest. As indicated by dotted lines, the angle of view of each pixel is divided into 3×3 segments and the central angle of view is colored black. Moreover, the colors of color filters are depicted by symbols R, G, and B. When an optical axis of an imaging optical system is at the center of a pixel, there is no change in the central angle of view as illustrated in FIG. 4C. However, when the optical axis of an imaging optical system is shifted from the center of a pixel, the central angle of view also changes according to the shift amount.

The angles of view of each pixel of the respective imaging regions will be described with reference to FIGS. 4C to 4G.

FIG. 4C represents the angles of view and the central angles of view of 4×4 pixels near the center of an imaging region. Since each imaging region is made up of 640×480 pixels, it is to be noted that there are also other pixels around the illustrated pixels. Solid-line frames in FIG. 4C indicate the angles of view covered by each pixel, the black frames indicate the central angles of view of each pixel, and the character R, G, or B in the frame represents the channel of the color filter. The angles of view in FIG. 4C represent the angles of view covered by the respective pixels in the fifth monocular imaging system having the fifth imaging optical system 115 disposed at the center of the 3×3 two-dimensional arrangement.

FIG. 4D illustrates the angles of view illustrated in FIG. 4C so as to be superimposed on the angles of view in a state in which the imaging optical system is shifted to the right by ⅔ pixel from the state illustrated in FIG. 4C. In the configuration of the imaging apparatus of the present embodiment, the angles of view of the fifth monocular imaging system and the fourth monocular imaging system of the fourth imaging optical system 114 are represented. That is, it is understood that the respective pixels of the imaging regions of the fourth and fifth monocular imaging systems cover angles of view while skipping some angles of view of all imaging regions.

FIG. 4E illustrates the angles of view illustrated in FIG. 4D so as to be superimposed on the angles of view in a state in which the imaging optical system is shifted to the left side by ⅔ pixel from the state illustrated in FIG. 4C. In the configuration of the imaging apparatus of the present embodiment, the angles of view of the fourth and fifth monocular imaging systems and the sixth monocular imaging system of the sixth imaging optical system 116 are represented.

FIG. 4F illustrates the angles of view illustrated in FIG. 4E so as to be superimposed on the angles of view in a state in which the imaging optical system is shifted to the lower side by ⅔ pixel from the state illustrated in FIG. 4E. In the configuration of the imaging apparatus of the present embodiment, the angles of view of the fourth to sixth monocular imaging systems and the first to third monocular imaging systems of the first to third imaging optical systems 111 to 113 are represented.

FIG. 4G illustrates the angles of view illustrated in FIG. 4F so as to be superimposed on the angles of view in a state in which the imaging optical system is shifted to the upper side by ⅔ pixel from the state illustrated in FIG. 4E. In the configuration of the imaging apparatus of the present embodiment, the angles of view of the first to sixth monocular imaging systems and the seventh to ninth monocular imaging systems of the seventh to ninth imaging optical systems 117 to 119 are represented. That is, substantially all angles of view of all imaging regions can be formed by the respective pixels of the imaging regions of the respective monocular imaging systems.

As described above, when a plurality of imaging optical systems are arranged such that different shift amounts are provided to the plurality of imaging optical systems arranged in the 3×3 two-dimensional arrangement, different angles of view are set to the respective pixels of all imaging regions. Moreover, when the shift amount provided to the horizontal direction and the vertical direction is set to any one of 0 pixel, +⅔ pixel, and −⅔ pixel and the color filters of the pixels of the monocular imaging system are arranged in the Bayer arrangement, the angles of view of all imaging regions can be arranged in the Bayer arrangement as illustrated in FIG. 4G. That is, the color filters of the pixels in a reconstructed image obtained by rearranging the respective pixels of all imaging regions can be set to the Bayer arrangement.

By performing an existing demosaicing process on this reconstructed image, it is possible to acquire a multi-pixel and high-resolution color image without decreasing a total number of pixels. In this way, it is possible to acquire an image having substantially the same number of pixels as the number of pixels of all imaging regions.

In this manner, by providing different shift amounts to the respective imaging optical systems of the plurality of imaging optical systems arranged two-dimensionally, it is possible to set different angles of view (imaging ranges) to the respective pixels of all imaging regions. Furthermore, since an image having the Bayer arrangement when it is reconstructed is obtained by setting different channels to adjacent angles of view, it is possible to provide an imaging apparatus capable of acquiring a multi-pixel and high-resolution image.

Figure 5:
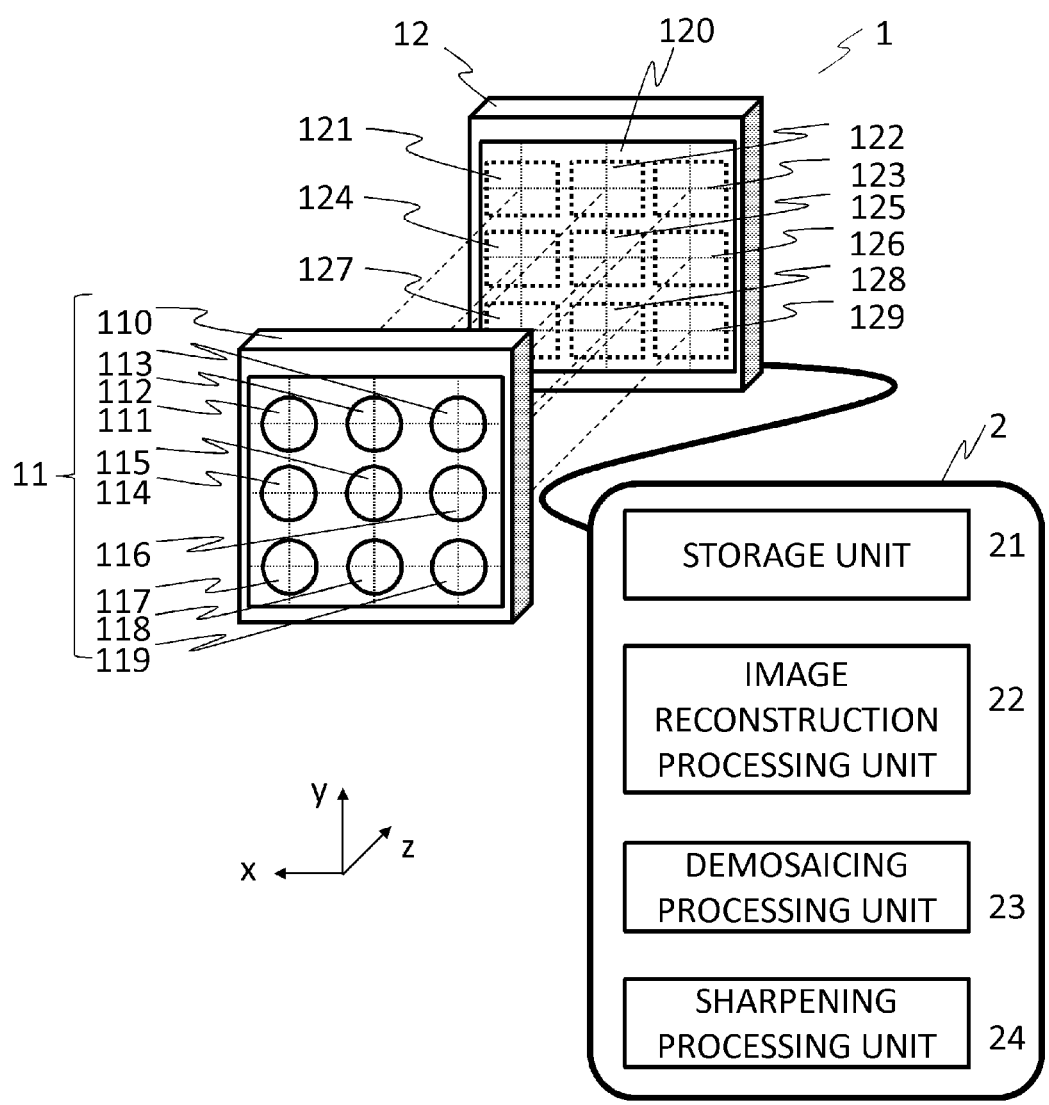
FIG. 5 is a diagram schematically illustrating an imaging apparatus and an image processing apparatus according to Embodiment 1.

FIG. 5 illustrates an image processing apparatus 2 capable of generating a multi-pixel and high-resolution image using the image photographed by the imaging apparatus of the present embodiment. The image processing apparatus 2 is an apparatus which includes a storage unit 21, an image reconstruction processing unit 22, a demosaicing processing unit 23, and a sharpening processing unit 24 and which is used by being connected to the imaging apparatus 1 of the present embodiment, for example. In the present embodiment, although the image processing apparatus 2 and the image processing apparatus 2 are integrated so that processed images can be displayed real-time, the imaging apparatus 1 and the image processing apparatus 2 may be separated and the process of FIG. 6 may be executed after photographing.

FIG. 6 illustrates the flow of a multi-pixel and high-resolution image generation process of the image processing apparatus illustrated in FIG. 5. Hereinafter, the steps of generating a multi-pixel and high-resolution image from the images acquired by a plurality of imaging optical systems will be described with reference to FIGS. 5 and 6.

The image processing apparatus 2 acquires image data acquired by the imaging device 120 of the imaging apparatus 1 and temporarily stores the image data in the storage unit 21. As illustrated in FIG. 6, the image acquired by the imaging device 120 of the imaging apparatus 1 is an image in which the images acquired by the respective imaging optical systems are arranged in respective divided regions of one image.

The image reconstruction processing unit 22 reads a photographed image (data D1) of which the region is divided for respective imaging optical systems from the storage unit 21 and executes an image reconstruction process (step S1). The image reconstruction process (step S1) is a process of rearranging the pixels of the photographed image (data D1) of which the region is divided for respective imaging optical systems according to the angles of view of the respective pixels. The image reconstruction process (step S1) is to perform the reconstruction process illustrated in FIGS. 4C to 4G. The image reconstruction processing unit 22 rearranges the pixels of the respective imaging regions by a shift amount of any one of 0 pixel, +⅔ pixel, and −⅔ pixel in the horizontal direction and the vertical direction according to the phases set to the plurality of imaging optical systems to generate a reconstructed image (data D2).

Since the reconstructed image generated herein is a multi-pixel image having a number of pixels that is approximately 3×3 (=9) times the number of pixels of the imaging region of each imaging optical system, and the respective pixels have different angles of view, the reconstructed image has detailed information of a subject and the resolution is improved. When the color filters of the respective pixels of the imaging region corresponding to each of the imaging optical systems arranged in the 3×3 two-dimensional arrangement are arranged in the Bayer arrangement and the above-described pixel shift is realized, the color filters of each of the pixels of the reconstructed image can be arranged in the Bayer arrangement. In this way, a demosaicing process can be executed subsequently and a multi-pixel and high-resolution color image having substantially the same number of pixels as the number of pixels of all imaging regions can be acquired.

The demosaicing processing unit 23 performs a demosaicing process (step S2) on the reconstructed image (data D2) generated in the image reconstruction process (step S1) according to an existing method and using the arrangement of the color filters to generate pixels of two different channels from surrounding pixels. In this way, it is possible to generate a multi-pixel and high-resolution color image (data D3) without decreasing the number of pixels. The method disclosed in "High-quality linear interpolation for demosaicing of Bayer-patterned color images," by Henrique S. Malvar, et al., IEEE International Conference on Acoustics, Speech, and Signal Processing, 2004, for example, may be used as the existing demosaicing process.

The sharpening processing unit 24 executes a sharpening process (step S3) on the image obtained by the demosaicing process (step S2). The sharpening processing unit 24 performs a filtering process such as an unsharpness mask as illustrated in FIG. 7A, for example, and performs edge enhancement to sharpen the image. The sharpening processing unit 24 may use an unsharpness filter illustrated in FIG. 7B instead of the filter illustrated in FIG. 7A. In FIG. 7B, a, b, and k are arbitrary integers.

In the individual images before reconstruction was performed, since the angle of view covered by one pixel is wide, pieces of information on a wide range of a subject are mixed in one pixel. Although the angle of view covered by one pixel is also wide in the reconstructed image (data D2), pixels of which the central angles of view are shifted by ⅓ pixel are arranged around a pixel of interest due to rearrangement. Although ⅓ of the surrounding pixels contain subject information different from that of the pixel of interest, which may contribute to improvement in resolution, ⅔ of the surrounding pixels have an angle of view that overlaps the angle of view of the pixel of interest, which means that the subject information of the pixel of interest spreads to the surrounding pixels. Due to this, by performing the sharpening process (step S3) on the multi-pixel and high-resolution color image (data D3), the subject information spreading to the surrounding pixels can be restored to the pixel of interest. In this way, it is possible to provide a high-resolution image that reproduces detailed information of a subject and to generate a multi-pixel and ultrahigh-resolution color image (data D4).

In the imaging apparatus of the present embodiment, each imaging region has 640×480 pixels and all imaging regions have 1920×1440 pixels. The reconstructed image (data D2), the multi-pixel and high-resolution color image (data D3), and the multi-pixel and ultrahigh-resolution color image (data D4) can be generated using 1920×1440 pixels, and a multi-pixel and high-resolution color image having the same number of pixels as that of all imaging regions can be acquired. This realizes images having multiple pixels and high resolution that are 3×3 times larger and higher than those of the pixels of a monocular imaging system.

Advantageous Effects of Present Embodiment

According to the imaging apparatus of the present embodiment, it is possible to acquire a multi-pixel and high-resolution color image. In a general pixel shift, since a plurality of images are photographed at different timings by moving imaging devices and lenses, it is not possible to photograph a moving image or a still image of a quickly moving subject. In contrast, the imaging apparatus of the present embodiment can photograph a subject simultaneously using a plurality of pixels arranged two-dimensionally and thus can acquire a multi-pixel and high-resolution color image from a moving image.

As compared to a case in which an image is formed on all imaging regions of the imaging device 120 using one imaging optical system, the present embodiment provides a merit that it is possible to reduce the thickness of an imaging optical system and to reduce the thickness of an imaging apparatus since the imaging region is divided by a plurality of imaging optical systems.

The lens unit 11 of the present embodiment is configured such that all imaging optical systems 111 to 119 are formed on and integrated with the lens board 110. Due to this, since the accuracy of the two-dimensional arrangement of the respective imaging devices can be increased, it is possible to set the phase difference with respect to a pixel pitch with high accuracy. For example, a lens surface may be machined directly on a crystal substrate by a lithography process or a lens surface may be formed on a lens board by a molding technique such as a replica technique. In this way, even when an imaging device in which the pixel pitch is as small as 3 μm or smaller is used, it is possible to set a phase difference of ⅔ pixel (that is, 2 μm) with high accuracy. In this manner, by integrating a plurality of imaging optical systems arranged two-dimensionally, it is possible to use an imaging device having a very small pixel pitch. When the pixel pitch is very small, since the interval between respective imaging devices can be narrowed, the influence of parallax is reduced. Due to this, it is possible to provide an imaging apparatus capable of reducing an error in a reconstructed image resulting from the subject distance and obtaining high-quality images always.

Embodiment 2

Figure 8A:
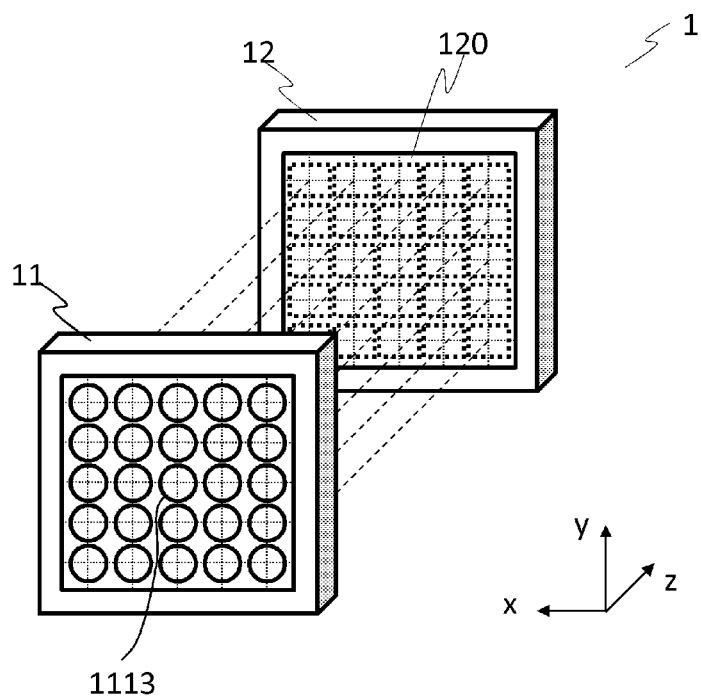
FIGS. 8A and 8B are diagrams schematically illustrating a configuration of an imaging apparatus according to Embodiment 2.

An imaging apparatus according to Embodiment 2 will be described. A difference between the present embodiment and Embodiment 1 is that the number of imaging optical systems provided in the lens unit 11 is changed and that the number of imaging regions on the imaging device 120 of the sensor unit 12 is the same as the number of imaging optical systems. FIG. 8A is a diagram schematically illustrating an imaging apparatus according to the present embodiment.

The imaging apparatus 1 of the present embodiment includes a lens unit 11 and a sensor unit 12 similarly to the imaging apparatus of Embodiment 1. The lens unit 11 of the present embodiment is a compound-eye lens unit in which imaging optical systems are arranged in a 5×5 two-dimensional arrangement. Moreover, imaging regions arranged in a 5×5 two-dimensional arrangement corresponding to the respective imaging optical systems are provided on the imaging device 120 of the sensor unit 12. In this way, the images of a subject photographed by the respective imaging optical systems are imaged on the respective imaging regions, and a photographed image is acquired by the imaging device 120. A combination of one imaging optical system and one imaging region corresponding to the imaging optical system of the imaging device is used as a monocular imaging system, and 5×5 monocular images acquired by the 5×5 monocular imaging systems are arranged in the image acquired by the imaging device 120.

Figure 8B:
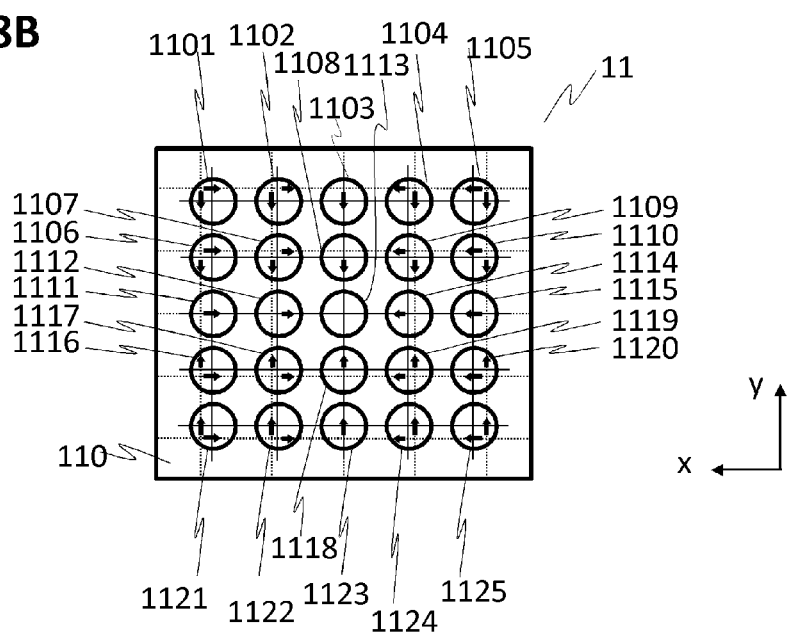

FIG. 8B illustrates a lens unit according to Embodiment 2. The lens unit 11 is a compound-eye lens unit in which first to 25th imaging optical systems 1101 to 1125 having the same shape are arranged on a lens board 110 in a 5×5 two-dimensional arrangement so as to be integrated with the lens board 110, and a 13th imaging optical system 1113 is disposed at the center.

In the present embodiment, the optical axis of the 13th imaging optical system 1113 is disposed at the center of the pixels of the imaging device 120, and the other imaging optical systems 1101 to 1112 and 1114 to 1125 are disposed such that the optical axes are shifted from the center of the pixels.

Arrows in FIG. 8B indicate how the respective imaging optical systems are shifted. The intersections of dotted lines in FIG. 8B indicate the positions of the optical axes when the imaging optical systems 1101 to 1125 are arranged in a non-shifted state, and the intersections of solid lines indicate the positions of the optical axes of the respective imaging optical systems after shifting. The shift amounts of the respective imaging optical systems (OSs) are illustrated in Table 2.

TABLE 2

SHIFT AMOUNTS OF OPTICAL SYSTEMS (OS)

| FIRST OS 1 1 0 1 | SECOND OS 1 1 0 2 | THIRD OS 1 1 0 3 | FOURTH OS 1 1 0 4 | FIFTH OS 1 1 0 5 |
|---|---|---|---|---|
| D s x 0 1 = -⅘ PX | D s x 0 2 = -⅖ PX | D s x 0 3 = 0 PX | D s x 0 4 = +⅖ PX | D s x 0 5 = +⅘ PX |
| D s y 0 1 = -⅘ PX | D s y 0 2 = -⅘ PX | D s y 0 3 = -⅘ PX | D s y 0 4 = -⅘ PX | D s y 0 5 = -⅘ PX |
| SIXTH OS 1 1 0 6 | SEVENTH OS 1 1 0 7 | EIGHTH OS 1 1 0 8 | NINTH OS 1 1 0 9 | 10TH OS 1 1 1 0 |
| D s x 0 6 = -⅘ PX | D s x 0 7 = -⅖ PX | D s x 0 8 = 0 PX | D s x 0 9 = +⅖ PX | D s x 1 0 = +⅘ PX |
| D s y 0 6 = -⅖ PX | D s y 0 7 = -⅖ PX | D s y 0 8 = -⅖ PX | D s y 0 9 = -⅖ PX | D s y 1 0 = -⅖ PX |
| 11TH OS 1 1 1 1 | 12TH OS 1 1 1 2 | 13TH OS 1 1 1 3 | 14TH OS 1 1 1 4 | 15TH OS 1 1 1 5 |
| D s x 1 1 = -⅘ PX | D s x 1 2 = -⅖ PX | D s x 1 3 = 0 PX | D s x 1 4 = +⅖ PX | D s x 1 5 = +⅘ PX |
| D s y 1 1 = 0 PX | D s y 1 2 = 0 PX | D s y 1 3 = 0 PX | D s y 1 4 = 0 PX | D s y 1 5 = 0 PX |
| 16TH OS 1 1 1 6 | 17TH OS 1 1 1 7 | 18TH OS 1 1 1 8 | 19TH OS 1 1 1 9 | 20TH OS 1 1 2 0 |
| D s x 1 6 = -⅘ PX | D s x 1 7 = -⅖ PX | D s x 1 8 = 0 PX | D s x 1 9 = +⅖ PX | D s x 2 0 = +⅘ PX |
| D s y 1 6 = +⅖ PX | D s y 1 7 = +⅖ PX | D s y 1 8 = +⅖ PX | D s y 1 9 = +⅖ PX | D s y 2 0 = +⅖ PX |
| 21ST OS 1 1 2 1 | 22ND OS 1 1 2 2 | 23RD OS 1 1 2 3 | 24TH OS 1 1 2 4 | 25TH OS 1 1 2 5 |
| D s x 2 1 = -⅘ PX | D s x 2 2 = -⅖ PX | D s x 2 3 = 0 PX | D s x 2 4 = +⅖ PX | D s x 2 5 = +⅘ PX |
| D s y 2 1 = -⅘ PX | D s y 2 2 = +⅘ PX | D s y 2 3 = +⅘ PX | D s y 2 4 = +⅘ PX | D s y 2 5 = +⅘ PX |

Different shift amounts (phases with respect to a pixel pitch) are provided to the imaging optical systems 1101 to 1112 and 1114 to 1125, and the shift amount is set to any one of the values of 0 pixel, ±⅖ pixel, and ±⅘ pixel in the horizontal direction and the vertical direction. Arrows in the drawing indicate the shift directions, and the imaging optical systems 1101 to 1112 and 1114 to 1125 are shifted in a direction closer to the 13th imaging optical system 1113 in both the horizontal direction and the vertical direction. With this configuration, the respective pixels in the plurality of imaging regions can cover different imaging ranges.

Next, a method of reconstructing a multi-pixel and high-resolution color image from monocular images acquired by the imaging devices of the respective imaging regions will be described with reference to FIGS. 9A to 9K.

Figure 9A:
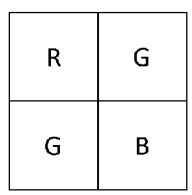
Figure 9B:
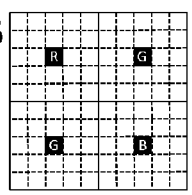
Figure 9C:
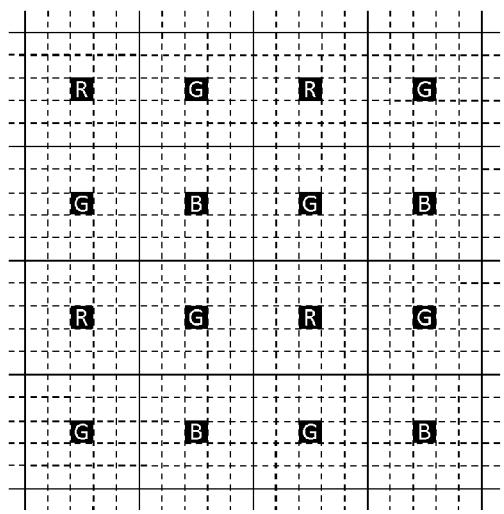

FIG. 9A is a diagram for describing the RGGB Bayer arrangement, FIG. 9B is a diagram illustrating the centers of respective pixels, FIG. 9C is a diagram for describing a pixel arrangement of each imaging region, and FIGS. 9D to 9G illustrate reconstructed images obtained by rearranging respective pixels of the respective imaging regions according to an angle of view.

Color filters of three channels of red (R), green (G), and blue (B) are arranged in the Bayer arrangement in the respective pixels of the imaging device 120 of the present embodiment. The imaging regions are similarly arranged in the RGGB Bayer arrangement illustrated in FIG. 9A.

FIG. 9B illustrates an angle of view of each pixel of FIG. 9A. As illustrated in FIG. 3B, one pixel covers an angle of view from one end of the pixel to the other end, and the angle of view at the center of the pixel is referred to as the central angle of view of the pixel of interest. The angle of view of each pixel is divided into 5×5 segments and the central angle of view is colored black. Moreover, the colors of color filters are depicted by symbols R, G, and B. When an optical axis of an imaging optical system is at the center of a pixel, there is no change in the central angle of view as illustrated in FIG. 3C. However, when the optical axis of an imaging optical system is shifted from the center of a pixel, the central angle of view also changes according to the shift amount.

The angles of view of each pixel of the respective imaging regions will be described with reference to FIGS. 9C to 9G.

FIG. 9C represents the angles of view and the central angles of view of 4×4 pixels near the center of an imaging region. Since each imaging region is made up of 400×300 pixels, it is to be noted that there are also other pixels around the illustrated pixels. Solid-line frames in FIG. 9C indicate the angles of view covered by each pixel, the black frames indicate the central angles of view of each pixel, and the character R, G, or B in the frame represents the channel of the color filter. The angles of view in FIG. 9C represent the angles of view covered by the respective pixels in the 13th monocular imaging system having the 13th imaging optical system 1113 disposed at the center of the 5×5 two-dimensional arrangement.

Figure 9E:
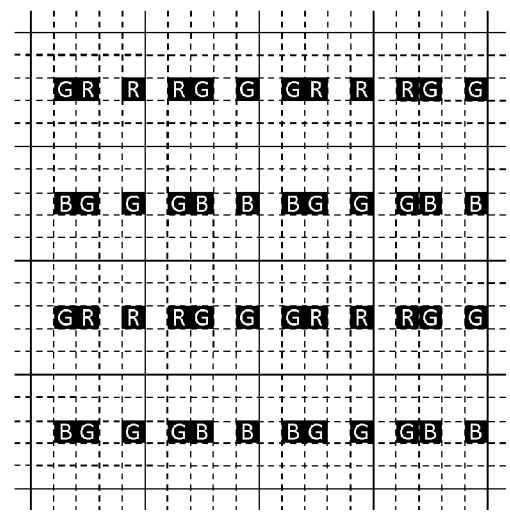
Figure 9D:
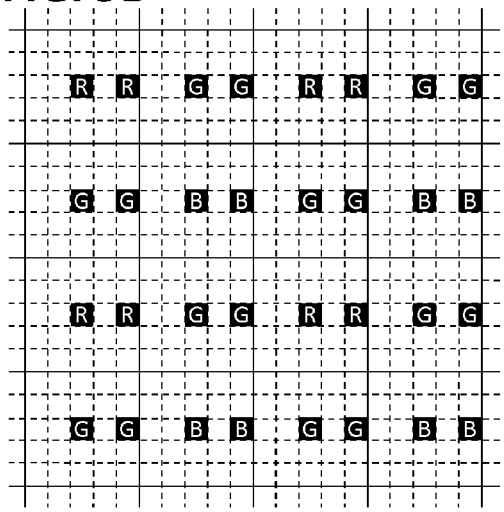

FIG. 9D illustrates the angles of view illustrated in FIG. 9C so as to be superimposed on the angles of view in a state in which the imaging optical system is shifted to the right by ⅖ pixel from the state illustrated in FIG. 9C. In the configuration of the imaging apparatus of the present embodiment, the angles of view of the 13th monocular imaging system and the 12th monocular imaging system of the 12th imaging optical system 1112 are represented.

FIG. 9E illustrates the angles of view illustrated in FIG. 9D so as to be superimposed on the angles of view in a state in which the imaging optical system is shifted to the right side by ⅘ pixel from the state illustrated in FIG. 9C. In the configuration of the imaging apparatus of the present embodiment, the angles of view of the 12th and 13th monocular imaging systems and the 11th monocular imaging system of the 11th imaging optical system 1111 are represented.

Figure 9F:
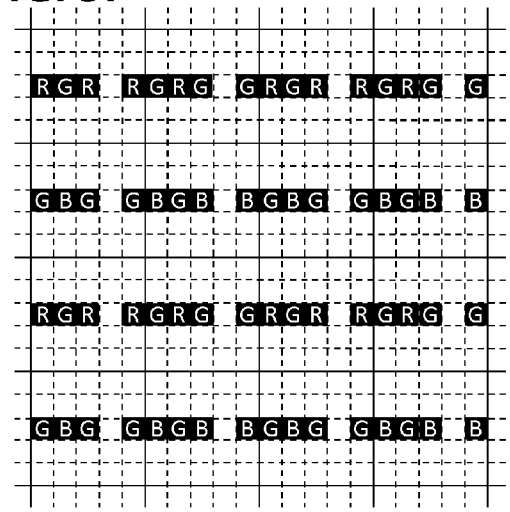

FIG. 9F illustrates the angles of view illustrated in FIG. 9E so as to be superimposed on the angles of view in a state in which the imaging optical system is shifted to the left side by ⅖ pixel from the state illustrated in FIG. 9C. In the configuration of the imaging apparatus of the present embodiment, the angles of view of the 11th, 12th, and 13th monocular imaging systems and the 14th monocular imaging system having the 14th imaging optical system 1114 are represented.

Figures 9G, 9H, 9I, 9J, 9K:
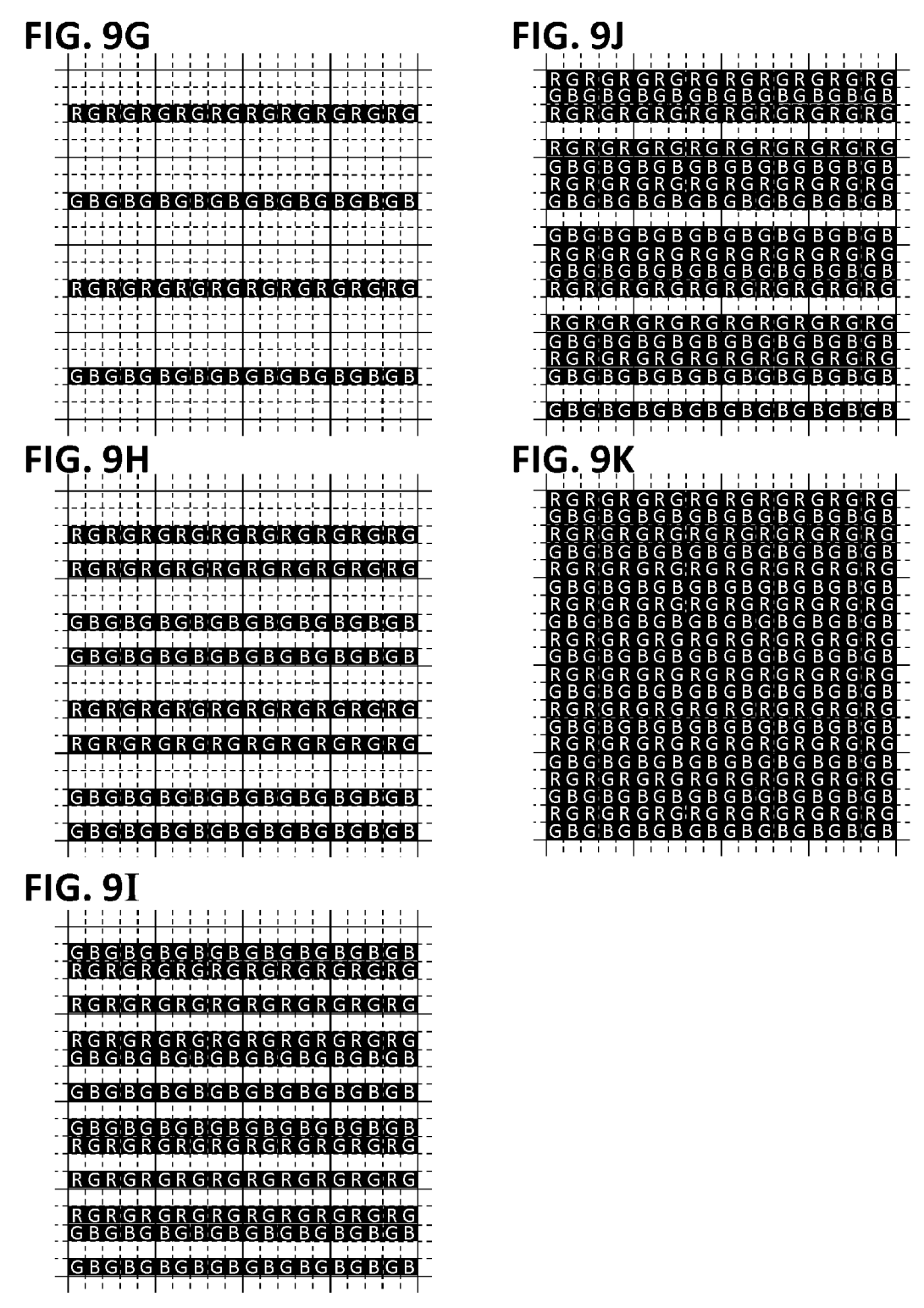

FIG. 9G illustrates the angles of view illustrated in FIG. 9F so as to be superimposed on the angles of view in a state in which the imaging optical system is shifted to the left side by ⅘ pixel from the state illustrated in FIG. 9C. In the configuration of the imaging apparatus of the present embodiment, the angles of view of the 11th, 12th, 13th, and 14th monocular imaging systems and the 15th monocular imaging system having the 15th imaging optical system 1115 are represented.

FIG. 9H illustrates the angles of view illustrated in FIG. 9G so as to be superimposed on the angles of view in a state in which the imaging optical system is shifted to the lower side by ⅖ pixel from the state illustrated in FIG. 9G. In the configuration of the imaging apparatus of the present embodiment, the angles of view of the 11th to 15th monocular imaging systems and the sixth to 10th monocular imaging systems having the sixth to 10th imaging optical systems 1106 to 1110 are represented.

FIG. 9I illustrates the angles of view illustrated in FIG. 9H so as to be superimposed on the angles of view in a state in which the imaging optical system is shifted to the lower side by ⅘ pixel from the state illustrated in FIG. 9G. In the configuration of the imaging apparatus of the present embodiment, the angles of view of the sixth to 15th monocular imaging systems and the first to fifth monocular imaging systems having the first to fifth imaging optical systems 1101 to 1105 are represented.

FIG. 9J illustrates the angles of view illustrated in FIG. 9I so as to be superimposed on the angles of view in a state in which the imaging optical system is shifted to the upper side by ⅖ pixel from the state illustrated in FIG. 9G. In the configuration of the imaging apparatus of the present embodiment, the angles of view of the first to 15th monocular imaging systems and the 16th to 20th monocular imaging systems having the 16th to 20th imaging optical systems 1116 to 1120 are represented.

FIG. 9K illustrates the angles of view illustrated in FIG. 9J so as to be superimposed on the angles of view in a state in which the imaging optical system is shifted to the upper side by ⅘ pixel from the state illustrated in FIG. 9G. In the configuration of the imaging apparatus of the present embodiment, the angles of view of the first to 20th monocular imaging systems and the 21st to 25th monocular imaging systems of the 21st to 25th imaging optical systems 1121 to 1125 are represented.

As described above, when a plurality of imaging optical systems are arranged such that different shift amounts are provided to the plurality of imaging optical systems arranged in the 5×5 two-dimensional arrangement, different angles of view (imaging ranges) are set to the respective pixels of all imaging regions. In the present embodiment, since the shift amount provided to the horizontal direction and the vertical direction is set to any one of 0 pixel, ±⅖ pixel, and ±⅘ pixel, it is possible to arrange adjacent angles of view at equal intervals and to acquire detailed information on the subject equally. Moreover, as illustrated in FIG. 9K, since the imaging devices are arranged in the RGGB Bayer arrangement, the reconstructed image obtained by rearranging the pixels of the respective imaging regions according to the angle of view can be arranged in the RGGB Bayer arrangement. Therefore, by performing a demosaicing process on the reconstructed image, it is possible to generate a multi-pixel and high-resolution color image. Furthermore, by performing a sharpening process on the reconstructed image obtained through the demosaicing process, it is possible to generate a multi-pixel and ultrahigh-resolution color image. The demosaicing process and the sharpening process are the same as those of Embodiment 1, and the description thereof will be omitted.

In the imaging apparatus of the present embodiment, each imaging region has 400×300 pixels and all imaging regions have 2000×1500 pixels. The reconstructed image (data D2), the multi-pixel and high-resolution color image (data D3), and the multi-pixel and ultrahigh-resolution color image (data D4) can be generated using 2000×1500 pixels, and a multi-pixel and high-resolution color image having the same number of pixels as that of all imaging regions can be acquired. This realizes images having multiple pixels and high resolution that are 5×5 times larger and higher than those of the pixels of a monocular imaging system. As compared to a case in which an image is formed on all imaging regions using one imaging optical system as in a general imaging apparatus, since the focal distance of each imaging optical system in the imaging apparatus of the present embodiment can be reduced by ⅕, the present embodiment provides a merit that it is possible to reduce the thickness of the lens unit 11 and to contribute to reducing the size of an imaging apparatus.

The imaging optical system 1113 at the center of the imaging optical systems arranged in the 5×5 two-dimensional arrangement is not shifted but the other imaging optical systems are shifted so as to approach the imaging optical system 1113, and the shift amount is set such that the closer to the imaging optical system 1113, the smaller is the difference in the shift amount from that of the imaging optical system 1113. Specifically, the magnitudes of the shift amounts with respect to the imaging optical system 1113, of the imaging optical systems 1112 and 1114 located near the imaging optical system 1113 in the horizontal direction and the imaging optical systems 1108 and 1118 located near the imaging optical system 1113 in the vertical direction are set the smallest value of ⅖ pixel. The shift amounts of the imaging optical systems 1107, 1109, 1117, and 1119 in both the horizontal direction and the vertical direction are set to ⅖ pixel (the magnitudes of the shift amounts are 2√⅖ pixel). The magnitudes of the shift amounts of the imaging optical systems 1103, 1111, 1115, and 1123 are set to ⅘ pixel. For the imaging optical systems 1102, 1104, 1106, 1110, 1116, 1120, 1122, and 1124, the shift amounts in either the horizontal direction or the vertical direction are set to ⅖ pixel and the shift amounts in the other direction are set to ⅘ pixel (the magnitudes of the shift amounts are 2√⅗ pixel). For the imaging optical systems 1101, 1105, 1121, and 1125 located farthest from the imaging optical system 1113, the shift amounts in both the horizontal direction and the vertical direction are set to ⅘ pixel (the magnitudes of the shift amounts are 4√⅖ pixel). By doing so, it is possible to suppress the difference in the shift amount from adjacent imaging optical systems as much as possible and to generate a high-quality reconstructed image.

According to the imaging apparatus of the present embodiment, it is possible to acquire a multi-pixel and high-resolution color image similarly to Embodiment 1.

Embodiment 3

The lens unit of Embodiment 1 has 3×3 imaging optical systems and the lens unit of Embodiment 2 has 5×5 imaging optical systems. In the present embodiment, a general case where a lens unit has (odd number)×(odd number) imaging optical systems will be described. In the present embodiment, the lens unit 11 has imaging optical systems arranged in a (2M+1)×(2N+1) two-dimensional arrangement. The imaging optical systems are arranged on the same substrate at an interval of 1 mm or smaller. Moreover, imaging regions arranged in a (2M+1)×(2N+1) two-dimensional arrangement corresponding to the imaging optical systems are provided on the imaging device 120 of the sensor unit 12, and color filters of the Bayer arrangement are provided in units of pixels. Here, M and N are integers of 0 or more and M=N or M≠N may be provided. Embodiment 1 corresponds to the case of M=N=1 and Embodiment 2 corresponds to the case of M=N=2.

In the present embodiment, each of the (2M+1)×(2N+1) imaging optical systems will be referred to as an imaging optical system (i, j). Here, −M≤i≤M and −N≤j≤N is provided, i indicates the position in the horizontal direction and j indicates the position in the vertical direction about the imaging optical system (0, 0). For example, imaging optical systems (1, 0), (−1, 0), (0, 1), and (0, −1) are imaging optical systems adjacent to the left, right, upper, and lower sides of the imaging optical system (0, 0), respectively. Here, a +x direction is the left side and a +y direction is the upper side. Moreover, imaging optical systems (−M, −N), (−M, N), (M, −N), and (M, N) are imaging optical systems located at the right-bottom, right-top, left-bottom, and left-top corners, respectively.

In the present embodiment, the imaging optical system (i, j) is arranged in a state in which an optical axis is shifted by −2×i/(2M+1) pixel in the horizontal direction and −2×j/(2N+1) pixel in the vertical direction from the center of a reference pixel of the imaging device. That is, the imaging optical system (0, 0) is disposed so that the optical axis coincides with a pixel center, whereas the imaging optical system (i, j) is disposed to be shifted by an amount corresponding to the distance to the imaging optical system (0, 0) so as to approach the imaging optical system (0, 0).

With this configuration, the respective pixels in the plurality of imaging regions can cover different imaging ranges. Moreover, by the reconstruction process, the demosaicing process, and the sharpening process similar to those of Embodiments 1 and 2, it is possible to acquire a multi-pixel and ultrahigh-resolution color image.

The arrangement of the imaging optical systems can be represented as an arrangement that a relative shift amount of each imaging optical system (i, j) in relation to the shift amount of the reference imaging optical system (0, 0) is directed toward the reference imaging optical system (0, 0) and the magnitude thereof has an amount corresponding to the distance from the reference imaging optical system (0, 0). The distance between imaging optical systems is the distance between optical axes. Although the reference imaging optical system is set to the imaging optical system (0, 0) located closest to the center of the lens unit in this example, the reference imaging optical system may be selected arbitrarily among (2M+1)×(2N+1) imaging optical systems.

The arrangement of the imaging optical systems can be specified as follows. That is, a difference in shift amount between imaging optical systems adjacent in the horizontal direction is 2/(2M+1) pixel in the horizontal direction, and a difference in shift amount between imaging optical systems adjacent in the vertical direction is 2/(2N+1) pixel in the vertical direction. A difference in shift amount between imaging optical systems adjacent in the diagonal direction is 2/(2M+1) pixel in the horizontal direction and is 2/(2N+1) pixel in the vertical direction.

As described above, although it is effective to shift the imaging optical systems so as to approach the imaging optical system at the center from the perspective of reduction of parallax, it is not always necessary to shift the imaging optical systems in this manner. The shift amount of each imaging optical system may be −2×Km/(2M+1) in the horizontal direction and −2×Kn/(2N+1) in the vertical direction (where −M≤Km≤M and −N≤Kn≤N), and all of the (2M+1)×(2N+1) imaging optical systems may have different shift amounts. As described above, in the present embodiment, since the parallax is sufficiently small, it is possible to acquire a multi-pixel and ultrahigh-resolution color image.

In the above-described example, although an imaging optical system (that is, an imaging optical system having a shift amount of zero) of which the optical axis coincides with the center of a reference pixel of a corresponding imaging region is present, such an imaging optical system may not be present. For example, the shift amount of the imaging optical system (i, j) may be set to Dx−2×Km/(2M+1) in the horizontal direction and Dy−2×Kn/(2N+1) in the vertical direction. Here, Km is an integer satisfying −M≤Km≤M and Kn is an integer satisfying −N≤Kn≤N.

In other words, not all imaging optical systems do not have mutually different shift amounts. At least some of (2M+1)×(2N+1) imaging optical systems may be arranged with a different shift amount from that of the other imaging optical systems. However, a predetermined number or more of imaging optical systems among the (2M+1)×(2N+1) imaging optical systems preferably have different shift amounts. The predetermined number may be, for example, 4, 8, the smallest integer of 50% or more of (2M+1)×(2N+1), the smallest integer of 80% or more of (2M+1)×(2N+1), or the smallest integer of 90% or more of (2M+1)×(2N+1). For example, a sufficiently high-resolution image is obtained if at least 8/9 (=88.8%) of all imaging optical systems have different shift amounts, and a higher-resolution image is obtained if at least 23/25 (=92%) of all imaging optical systems have different shift amounts. The best effect is obtained when all imaging optical systems have different shift amounts.

Embodiment 4

An imaging apparatus according to Embodiment 4 will be described. A difference between the present embodiment and Embodiment 1 is that the number of imaging optical systems provided in the lens unit 11 is changed and that the number of imaging regions on the imaging device 120 of the sensor unit 12 is the same as the number of imaging optical systems. FIG. 10A is a diagram schematically illustrating an imaging apparatus according to the present embodiment.

(Arrangement of Imaging Optical System and Imaging Device)

An imaging apparatus 1 of the present embodiment includes a lens unit 11 and a sensor unit 12 similarly to the imaging apparatus of Embodiment 1. The lens unit 11 of the present embodiment is a compound-eye lens unit in which imaging optical systems are arranged in a 2×2 two-dimensional arrangement. Moreover, imaging regions arranged in a 2×2 two-dimensional arrangement corresponding to the respective imaging optical systems are provided on the imaging device 120 of the sensor unit 12. In this way, the images of a subject photographed by the respective imaging optical systems are imaged on the respective imaging regions, and a photographed image is acquired by the imaging device 120. A combination of one imaging optical system and one imaging region corresponding to the imaging optical system of the imaging device is used as a monocular imaging system, and 2×2 monocular images acquired by the respective monocular imaging systems are arranged in the image acquired by the imaging device 120.

FIGS. 10B and 10C illustrate the lens unit of the present embodiment. An arrangement of the imaging optical systems in the imaging apparatus of the present embodiment will be described with reference to FIG. 10B. The lens unit 11 is a compound-eye lens unit in which four imaging optical systems 111 to 114 are arranged on the lens board 110 in a 2×2 two-dimensional arrangement so as to be integrated with the lens board 110. In the present embodiment, a plurality of imaging optical systems are arranged in a (even number)×(even number) two-dimensional arrangement, and a central imaging optical system is not present. Therefore, in the imaging apparatus of the present embodiment, the fourth imaging optical system 114 is used as a reference imaging optical system. The reference imaging optical system is not limited to the fourth imaging optical system 114 but may be set to any one of the imaging optical systems 111 to 114.

In the present embodiment, the fourth imaging optical system 114 is not shifted and the other imaging optical systems 111 to 113 are arranged to be shifted. The shift amounts of the respective imaging optical systems (OSs) are illustrated in Table 3.

TABLE 3

SHIFT AMOUNTS OF OPTICAL SYSTEMS (OS)

| FIRST OS 1 1 1 | SECOND OS 1 1 2 |
|---|---|
| D s x 1 = ½ PX | D s x 2 = 0 PX |
| D s y 1 = -½ PX | D s y 2 = -½ PX |
| THIRD OS 1 1 3 | FOURTH OS 1 1 4 |
| D s x 3 = -½ PX | D s x 4 = 0 PX |
| D s y 3 = 0 PX | D s y 4 = 0 PX |

Different shift amounts are provided to the imaging optical systems 111 to 114, and the shift amount in the horizontal direction and the vertical direction is set to any one of the values of 0 pixel and -½ pixel. Arrows in FIG. 10B indicate the shift directions, and the imaging optical systems 111 to 113 are shifted in a direction closer to the fourth imaging optical system 114.

An arrangement of color filters will be described with reference to FIG. 10C. In the imaging apparatus of the present embodiment, the imaging regions 121 to 124 of the imaging device 12 are defined so as to correspond to the imaging optical systems 111 to 114. Respective pixels in one imaging region use the same type of color filters and use a different type of color filters from those used in adjacent imaging regions. Specifically, the respective pixels of the imaging region 121 corresponding to the first imaging optical system 111 has color filters of blue (B). Similarly, the pixels of the imaging regions 122 and 123 corresponding to the second and third imaging optical systems 112 and 113 have color filters of green (G). The respective pixels of the imaging region 124 corresponding to the fourth imaging optical system 114 have color filters of red (R).

The imaging optical systems 111 to 114 of the present embodiment are configured such that the optical performance is the highest in the spectrum of the color filters covered by the respective optical systems. Specifically, the first imaging optical system 111 satisfactorily corrects axial chromatic aberration and magnification chromatic aberration in the spectrum included in the blue (B) channel. Furthermore, a diffraction surface is used in the imaging optical system, and the diffraction efficiency of the diffraction surface is maximized in the spectrum included in the blue (B) channel. Similarly, the second and third imaging optical systems 112 and 113 and the fourth imaging optical system 114 satisfactorily correct axial chromatic aberration and magnification chromatic aberration and maximizes diffraction efficiency in the spectrum included in the green (G) and red (R) channels, respectively.

As described above, by arranging a plurality of imaging optical systems so as to have different shift amounts, the angles of view (imaging ranges) covered by all pixels in a plurality of imaging regions can be made different. Furthermore, when color filters are arranged in the Bayer arrangement in respective imaging regions, unlike Japanese Patent Application Publication No. 2006-186512 (FIGS. 15A to 15C), a high-resolution image of the Bayer arrangement is obtained by performing a reconstruction process of rearranging the respective pixels according to the angle of view. The details will be described in the description of the reconstruction process. Moreover, the respective imaging optical systems are configured such that the optical performance is the highest in the spectrum (wavelength) of the color filters covered by the imaging optical systems. Therefore, it is possible to provide necessary optical performance using an optical system having a simpler configuration than an optical system that corrects chromatic aberration and improves diffraction efficiency in the spectrum included in all channels.

(Reconstruction Process)

Next, a method of reconstructing a multi-pixel and high-resolution image from monocular images acquired by monocular imaging systems will be described with reference to FIGS. 11A to 11G.

Figure 11A:
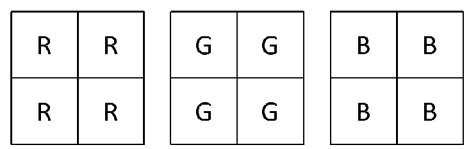
FIGS. 11A to 11G are diagrams for describing an imaging range of each pixel and a reconstruction process according to Embodiment 4.

FIG. 11A illustrates color filters arranged in the respective imaging regions on the imaging device 120. In the present embodiment, the respective pixels of the imaging region 124 has color filters of red (R), the pixels of the imaging regions 122 and 123 have color filters of green (G), and the pixels of the imaging region 121 have color filters of blue (B).

Figure 11B:
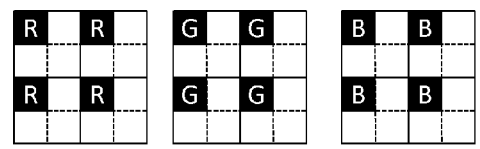

FIG. 11B illustrates the angle of view covered by each pixel illustrated in FIG. 11A. As illustrated in FIG. 3B, one pixel covers an angle of view from one end of the pixel to the other end, and the angle of view at the center of the pixel is referred to as the central angle of view of the pixel of interest. As indicated by dotted lines, the angle of view covered by each pixel is divided into 2×2 segments and the angle of view at the left-top corner is colored black, and color filters are depicted by symbols. When an optical axis of an imaging optical system is at the center of a pixel, there is no change in the central angle of view as illustrated in FIG. 3C. However, when the optical axis of an imaging optical system is shifted from the center of a pixel, the central angle of view also changes according to the shift amount.

Figure 11C:
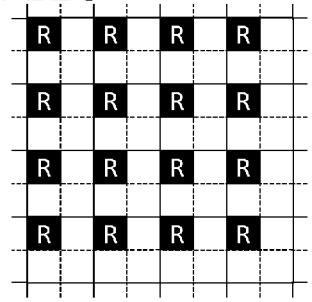
Figure 11D:
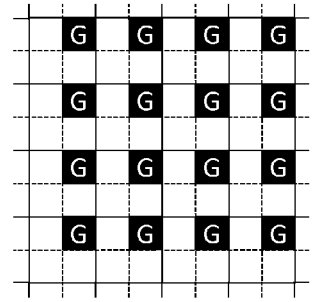
Figure 11E:
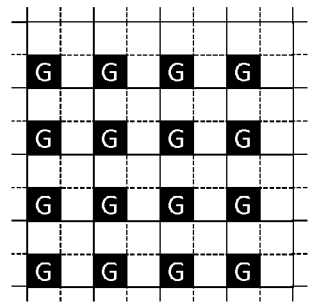

The angles of view of each pixel of the respective imaging regions will be described with reference to FIGS. 11C to 11F. FIGS. 11C to 11F represent the angles of view and the central angles of view of 4×4 pixels near the center of an imaging region. Since the imaging regions of the monocular imaging systems illustrated in FIGS. 11C to 11E are made up of 1920×1080 pixels, it is to be noted that there are also other pixels around the illustrated pixels. Solid-line frames in FIGS. 11C to 11F indicate the angles of view covered by each pixel, the black frames indicate the central angles of view of each pixel, and the character R, G, or B in the frame represents the channel of the color filter.

Figure 11F:
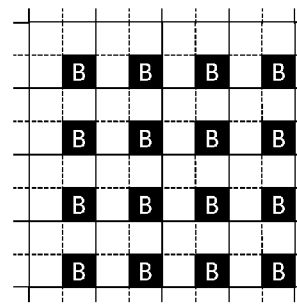

FIG. 11C illustrates the angle of view of the fourth monocular imaging system including the fourth imaging optical system 114 and the fourth imaging region 124. Since the fourth imaging optical system 114 has an optical axis disposed at the center of a pixel, the angle of view is not moved. FIG. 11D illustrates the angle of view of the third monocular imaging system including the third imaging optical system 113 and the third imaging region 123. Since the third imaging optical system 113 is shifted by −½ pixel in the horizontal direction only, the angle of view covered by each pixel is moved to the right side by an angle corresponding to ½ pixel. The angle of view of one pixel is divided into 2×2 segments by dotted lines, and one segment is shifted. FIG. 11E illustrates the angle of view of the second monocular imaging system including the second imaging optical system 112 and the second imaging region 122. Since the second imaging optical system 112 is shifted by −½ pixel in the vertical direction only, the angle of view covered by each pixel is shifted to the lower side by an angle corresponding to ½ pixel. FIG. 11F illustrates the angle of view of the first monocular imaging system including the first imaging optical system 111 and the first imaging region 121.

Figure 11G:
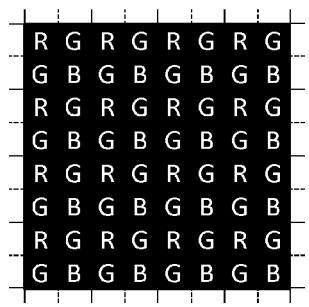

FIG. 11G illustrates the angles of view illustrated in FIGS. 11C to 11F so as to be superimposed on each other and represents the angles of view of all monocular imaging systems of the imaging apparatus of the present embodiment.

As described above, when a plurality of imaging optical systems are arranged such that different shift amounts are provided to the plurality of imaging optical systems arranged in the 2×2 two-dimensional arrangement, different angles of view (imaging ranges) are set to the respective pixels of all imaging regions. The shift amount in the horizontal direction and the vertical direction provided to each monocular imaging system is set to any one of 0 pixel and −½ pixel. Moreover, the same color filters are used in one monocular imaging systems, and different color filters are used in respective monocular imaging systems. With this configuration, the pixels of the reconstructed image obtained from the images obtained from the respective imaging regions can be arranged in the Bayer arrangement. When the pixels of the respective imaging regions are arranged in the Bayer arrangement, uneven pseudo-high resolution is realized such that pixels of the same color are placed close to each other as illustrated in FIG. 15C, and color unevenness and a false color occurs. In contrast, since the reconstructed images of the present embodiment are arranged in the Bayer arrangement, a high-quality and high-resolution image in which occurrence of color unevenness and a false color is suppressed is obtained.

By performing an existing demosaicing process on this reconstructed image, it is possible to acquire a multi-pixel and high-resolution color image without decreasing a total number of pixels. In this way, it is possible to acquire an image having substantially the same number of pixels as the number of pixels of all imaging regions.

In this manner, by providing different shift amounts to the plurality of imaging optical systems arranged two-dimensionally to set different angles of view to respective pixels of all imaging regions and setting different channels to adjacent angles of view, it is possible to provide an imaging apparatus capable of acquiring a multi-pixel and high-resolution image.

Embodiment 5

Figure 12:
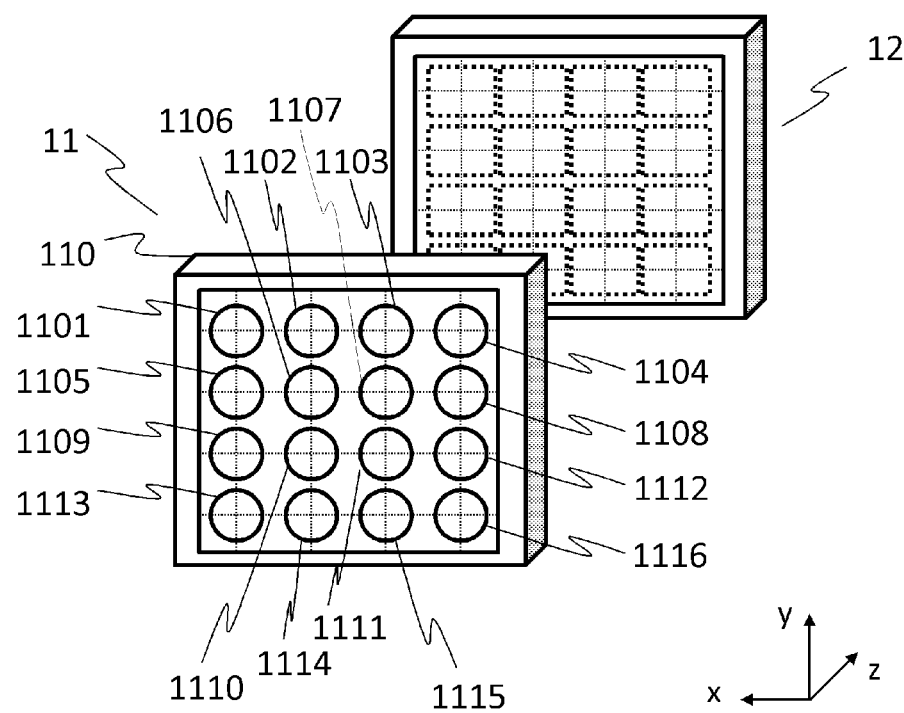
FIG. 12 is a diagram schematically illustrating a configuration of an imaging apparatus according to Embodiment 5.

An imaging apparatus according to Embodiment 5 will be described. A difference between the present embodiment and Embodiment 4 is that the number of imaging optical systems provided in the lens unit 11 is changed and that the number of imaging regions on the imaging device 120 of the sensor unit 12 is the same as the number of imaging optical systems. FIG. 12 is a diagram schematically illustrating an imaging apparatus according to the present embodiment.

The imaging apparatus 1 of the present embodiment includes a lens unit 11 and a sensor unit 12 similarly to Embodiment 4. The lens unit 11 is a compound-eye lens unit in which imaging optical systems are arranged in a 4×4 two-dimensional arrangement. Moreover, imaging regions arranged in a 4×4 two-dimensional arrangement corresponding to the respective imaging optical systems are provided on the imaging device 120 of the sensor unit 12. In this way, the images of a subject photographed by the respective imaging optical systems are imaged on the respective imaging regions, and a photographed image is acquired by the imaging device 120. A combination of one imaging optical system and one imaging region corresponding to the imaging optical system of the imaging device is used as a monocular imaging system, and 4×4 monocular images acquired by the respective monocular imaging systems are arranged in the image acquired by the imaging device 120.

Figure 13A:
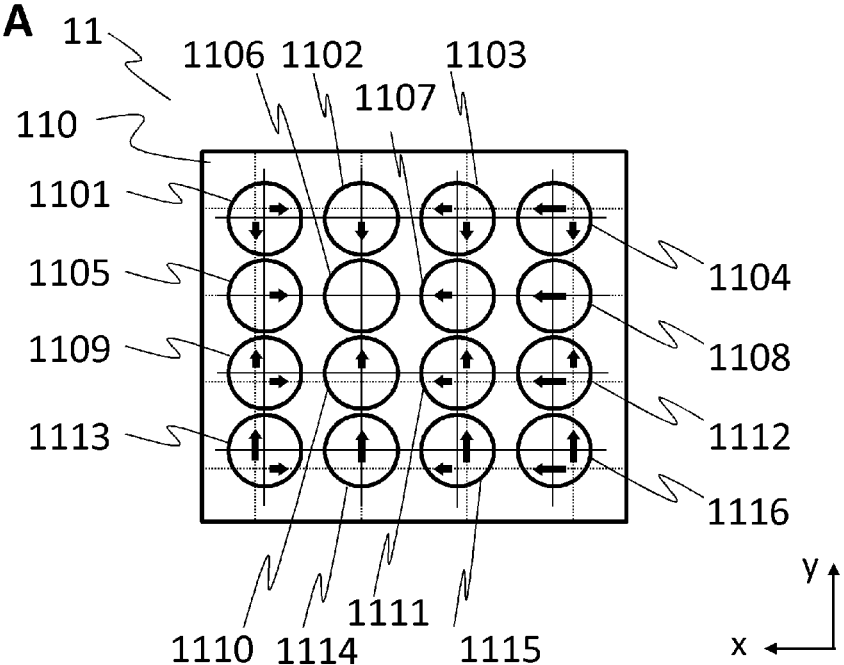
FIGS. 13A and 13B are diagrams for describing a shift and imaging colors of an imaging optical system according to Embodiment 5.
Figure 13B:
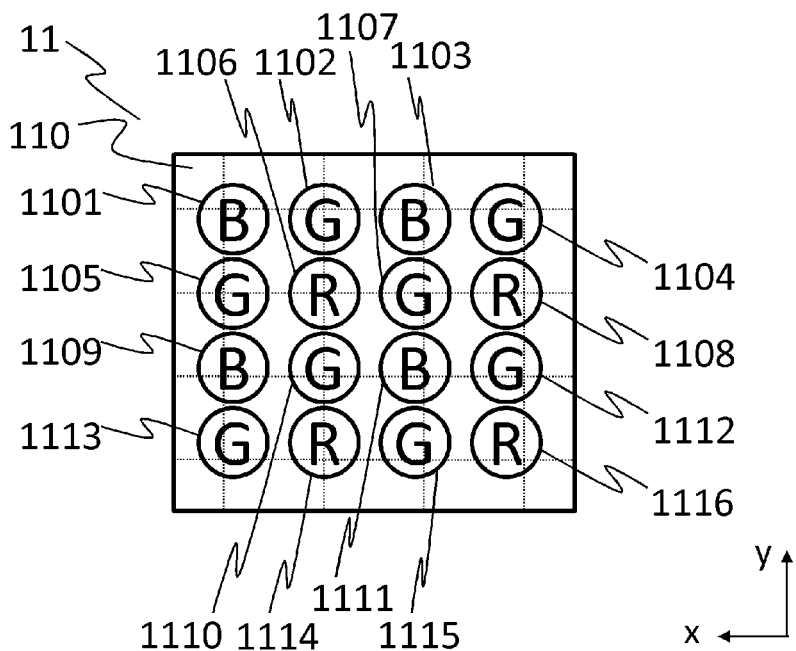

FIGS. 13A and 13B illustrate the lens unit according to the present embodiment. An arrangement of the imaging optical systems in the imaging apparatus of the present embodiment will be described with reference to FIG. 13A. The lens unit 11 is a compound-eye lens unit in which 16 imaging optical systems 1101 to 1116 are arranged on the lens board 110 in a 4×4 two-dimensional arrangement so as to be integrated with the lens board 110. In the present embodiment, a plurality of imaging optical systems are arranged in a (even number)×(even number) two-dimensional arrangement, and a central imaging optical system is not present. Therefore, in the imaging apparatus of the present embodiment, the sixth imaging optical system 1106 located closest to the center of the lens unit is used as a reference imaging optical system. The reference imaging optical system is not limited to the sixth imaging optical system 1106 but may be set to any one of the imaging optical systems 1101 to 1116.

In the present embodiment, the sixth imaging optical system 1106 is not shifted and the other imaging optical systems 1101 to 1105 and 1107 to 1116 are arranged to be shifted. The optical axis of a reference optical system may not necessarily be at the center of a pixel, and the reference optical system may be shifted. Since a difference in the shift amount from that of the reference imaging optical system is one of the important factors, the reference imaging optical system is not shifted for better understanding of the invention. The shift amounts of the respective imaging optical systems (OSs) are illustrated in Table 4.

TABLE 4

SHIFT AMOUNTS OF OPTICAL SYSTEMS (OS)

| FIRST OS 1 1 0 1 | SECOND OS 1 1 0 2 | THIRD OS 1 1 0 3 | FOURTH OS 1 1 0 4 |
|---|---|---|---|
| D s x 0 1 = −¼ PX | D s x 0 2 = 0 PX | D s x 0 3 = +¼ PX | D s x 0 4 = +¾ PX |
| D s y 0 1 = ¼ PX | D s y 0 2 = ¼ PX | D s y 0 3 = ¼ PX | D s y 0 4 = ¼ PX |
| FIFTH OS 1 1 0 5 | SIXTH OS 1 1 0 6 | SEVENTH OS 1 1 0 7 | EIGHTH OS 1 1 0 8 |

TABLE 4-continued

SHIFT AMOUNTS OF OPTICAL SYSTEMS (OS)

| | | | |
|---|---|---|---|
| D s x 0 5 = −¼ PX | D s x 0 6 = 0 PX | D s x 0 7 = +¼ PX | D s x 0 8 = +²⁄₄ PX |
| D s y 0 5 = 0 PX | D s y 0 6 = 0 PX | D s y 0 7 = 0 PX | D s y 0 8 0 PX |
| NINTH OS 1 1 0 9 | 10TH OS 1 1 1 0 | 11TH OS 1 1 1 1 | 12TH OS 1 1 1 2 |
| D s x 0 9 = −¼ PX | D s x 1 0 = 0 PX | D s x 1 1 = +¼ PX | D s x 1 2 = +²⁄₄ PX |
| D s y 0 9 = +¼ PX | D s y 1 0 = +¼ PX | D s y 1 1 = +¼ PX | D s y 1 2 = +¼ PX |
| 13TH OS 1 1 1 3 | 14TH OS 1 1 1 4 | 15TH OS 1 1 1 5 | 16TH OS 1 1 1 6 |
| D s x 1 3 = ¼ PX | D s x 1 4 = 0 PX | D s x 1 5 = +¼ PX | D s x 1 6 = +²⁄₄ PX |
| D s y 1 3 = +²⁄₄ PX | D s y 1 4 = +²⁄₄ PX | D s y 1 5 = +²⁄₄ PX | D s y 1 6 = +²⁄₄ PX |

Different shift amounts are provided to the imaging optical systems 1101 to 1116, and the shift amount in the horizontal direction and the vertical direction is set to any one of the values of −¼ pixel, 0 pixel, +¼ pixel, and +²⁄₄ pixel. Arrows in FIG. 13A indicate the shift directions, and the imaging optical systems 1101 to 1116 are shifted in a direction closer to the sixth imaging optical system 1106.

An arrangement of color filters will be described with reference to FIG. 13B. In the imaging apparatus of the present embodiment, the imaging regions 1201 to 1216 of the imaging device are defined so as to correspond to the imaging optical systems 1101 to 1116. Respective pixels in one imaging region use the same type of color filters and use a different type of color filters from those used in adjacent imaging regions. Specifically, the respective pixels of the imaging regions 1201, 1203, 1209, and 1211 corresponding to the imaging optical systems 1101, 1103, 1109, and 1111 have color filters of blue (B). Similarly, the pixels of the imaging regions 1202, 1204, 1205, 1207, 1210, 1212, 1213, and 1215 corresponding to the imaging optical systems 1102, 1104, 1105, 1107, 1110, 1112, 1113, and 1115 have color filters of green (G). The respective pixels of the imaging regions 1206, 1208, 1214, and 1216 corresponding to the imaging optical systems 1106, 1108, 1114, and 1116 have color filters of red (R).

The imaging optical systems are configured such that the optical performance is the highest in the spectrum of the color filters covered by the respective optical systems similarly to Embodiment 4.

Due to the above-described configuration, effects similar to Embodiment 4 are obtained.

Next, a method of reconstructing a multi-pixel and high-resolution image from monocular images acquired by monocular imaging systems will be described with reference to FIGS. 14A to 14G.

Figure 14A:
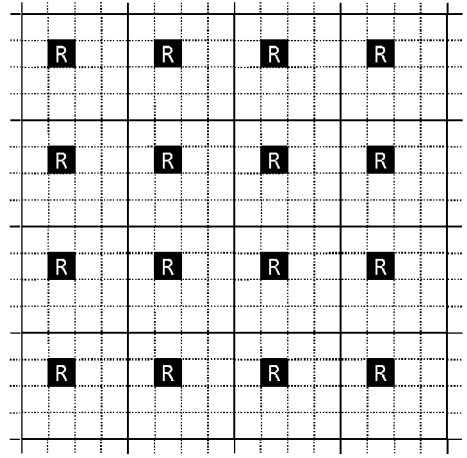
FIGS. 14A to 14F are diagrams for describing an imaging range of each pixel and a reconstruction process according to Embodiment 5.

FIG. 14A illustrates the angle of view of the sixth monocular imaging system. FIG. 14A represents the angles of view and the central angles of view of 4×4 pixels near the center of an imaging region. Solid-line frames in FIG. 14A indicate the angles of view covered by each pixel, the black frames indicate the central angles of view of each pixel, and the character R, G, or B in the frame represents the channel of the color filter. Since a red channel (R) is set to the sixth monocular imaging system and the optical axis of the imaging optical system 1106 is set at the center of the pixels of the imaging device, the angle of view is not shifted.

Figure 14B:
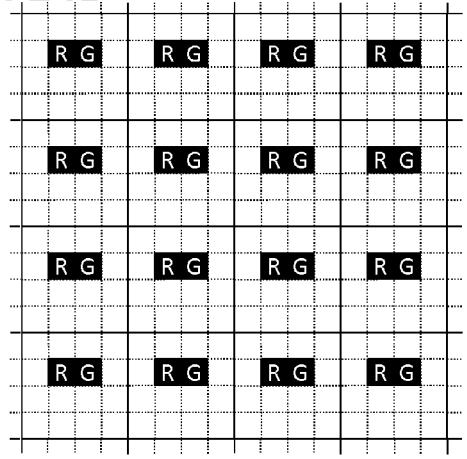

FIG. 14B illustrates the angles of view illustrated in FIG. 14A so as to be superimposed on the angles of view of the fifth monocular imaging system. Color filters of the green (G) channel are provided in the fifth monocular imaging system. Since the fifth imaging optical system 1105 is shifted by −¼ pixel in the horizontal direction, the angle of view is shifted by ¼ pixel to the right side in relation to the angle of view of the monocular imaging system of the reference imaging optical system 1106 illustrated in FIG. 14A and is disposed to the side of the angle of view of the sixth monocular imaging system.

Figure 14C:
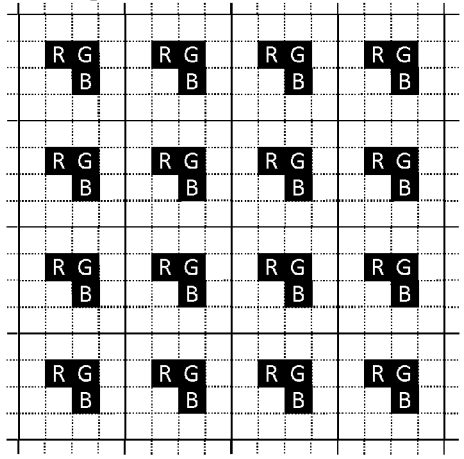

FIG. 14C illustrates the angles of view illustrated in FIG. 14B so as to be superimposed on the angles of view of the first monocular imaging system. Color filters of the blue (B) channel are provided in the first monocular imaging system. Since the first imaging optical system 1101 is shifted by −¼ pixel in the horizontal direction and −¼ pixel in the vertical direction, the angle of view is shifted by ¼ pixel to the right side and ¼ pixel to the lower side in relation to the angle of view of the monocular imaging system of the reference imaging optical system 1106 illustrated in FIG. 14A.

Figure 14D:
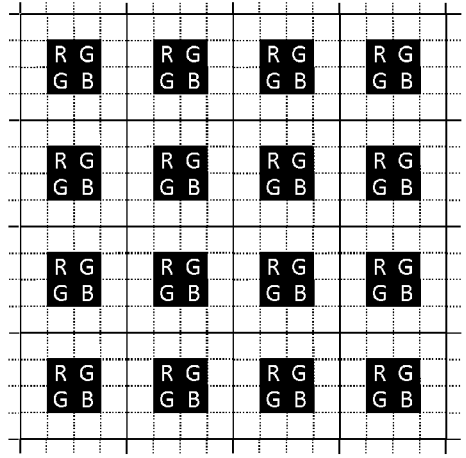

FIG. 14D illustrates the angles of view illustrated in FIG. 14C so as to be superimposed on the angles of view of the second monocular imaging system. Color filters of the green (G) channel are provided in the second monocular imaging system. Since the second imaging optical system 1102 is shifted by 0 pixel in the horizontal direction and −¼ pixel in the vertical direction, the angle of view is shifted by ¼ pixel to the lower side in relation to the angle of view of the monocular imaging system of the reference imaging optical system 1106 illustrated in FIG. 14A.

Figure 14E:
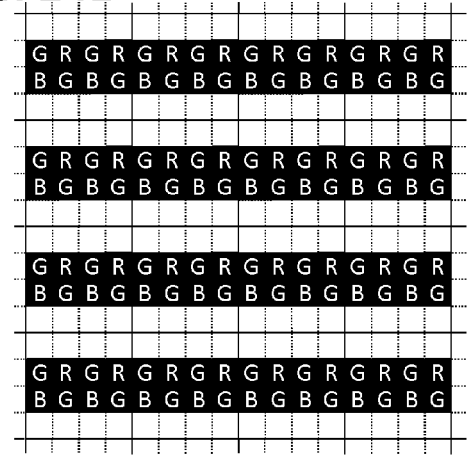

FIG. 14E illustrates the angles of view illustrated in FIG. 14D so as to be superimposed on the angles of view of the third, fourth, seventh, and eighth monocular imaging systems. The angles of view of the monocular imaging systems are shifted according to a phase difference with respect to the pixel pitches provided to the respective imaging optical systems.

Figure 14F:
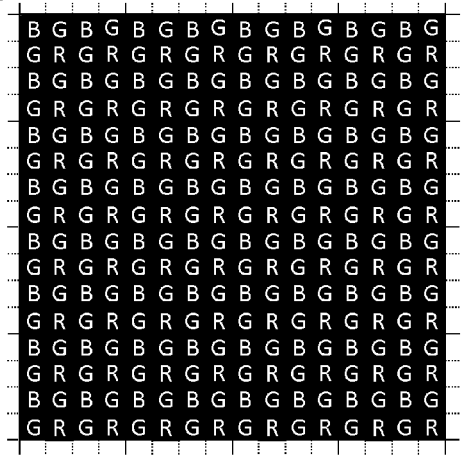

FIG. 14F illustrates the angles of view illustrated in FIG. 14E so as to be superimposed on the angles of view of the ninth to 16th monocular imaging systems. The angles of view of all pixels are arranged without any gap and different angles of view are set to all pixels of the imaging region. Moreover, the color filters are arranged in the Bayer arrangement when the pixels are rearranged according to the angle of view.

As described above, when a plurality of imaging optical systems are arranged such that different phases are provided to the pixel pitches of the imaging devices of the plurality of imaging optical systems arranged in the 4×4 two-dimensional arrangement, different angles of view are set to the respective pixels of all imaging regions. Moreover, the same color filters are used in one monocular imaging systems, and different color filters are used in respective monocular imaging systems. With this configuration, the pixels of the reconstructed image obtained from the images obtained from the respective imaging regions can be arranged in the Bayer arrangement. When the pixels of the respective imaging regions are arranged in the Bayer arrangement, uneven pseudo-high resolution is realized such that pixels of the same color are placed close to each other as illustrated in FIG. 15C, and color unevenness and a false color occurs. In contrast, since the reconstructed images of the present embodiment are arranged in the Bayer arrangement, a high-quality and high-resolution image in which occurrence of color unevenness and a false color is suppressed is obtained.

By performing an existing demosaicing process on this reconstructed image, it is possible to acquire a multi-pixel and high-resolution color image without decreasing a total number of pixels. In this way, it is possible to acquire an image having substantially the same number of pixels as the number of pixels of all imaging regions.

In this manner, by providing different shift amounts to the plurality of imaging optical systems arranged two-dimensionally to set different angles of view to respective pixels of all imaging regions and setting different channels to adjacent angles of view, it is possible to provide an imaging apparatus capable of acquiring a multi-pixel and high-resolution image.

Embodiment 6

The lens unit of Embodiment 4 has 2×2 imaging optical systems and the lens unit of Embodiment 5 has 4×4 imaging optical systems. In the present embodiment, a general case where a lens unit has (even number)×(even number) imaging optical systems will be described. In the present embodiment, the lens unit 11 has imaging optical systems arranged in a 2M×2N two-dimensional arrangement. The imaging optical systems are arranged on the same substrate at an interval of 1 mm or smaller. Moreover, imaging regions arranged in a 2M×2N two-dimensional arrangement corresponding to the imaging optical systems are provided on the imaging device 120 of the sensor unit 12. Color filters of the same type are arranged in the pixels of one imaging region, and color filters are arranged in the Bayer arrangement in respective imaging regions. Here, M and N are integers of 1 or more and M=N or M≠N may be provided. Embodiment 4 corresponds to the case of M=N=1 and Embodiment 5 corresponds to the case of M=N=2.

In the present embodiment, each of the 2M×2N imaging optical systems will be referred to as an imaging optical system (i, j). Here, $-M+1 \leq i \leq M$ and $-N+1 \leq j \leq N$. i indicates the position in the horizontal direction and j indicates the position in the vertical direction. For example, an imaging optical system (M, N) is an optical system at the left-top corner, and imaging optical systems (M, N−1), (M−1, N), and (M−1, N−1) are imaging optical systems located on the lower side, the right side, and the right-bottom side of the imaging optical system (M, N). Here, a +x direction is the left side and a +y direction is the upper side. Moreover, imaging optical systems (−M+1,−N+1), (−M+1, N), and (M, −N+1) are imaging optical systems located at the right-bottom corner, right-top, and left-bottom corners, respectively.

In the present embodiment, the imaging optical system (i, j) is arranged in a state in which an optical axis is shifted by $-\frac{1}{2} \times i/M$ pixel in the horizontal direction and $-\frac{1}{2} \times j/N$ pixel in the vertical direction from the center of a reference pixel of the imaging device. That is, the imaging optical system (0, 0) is disposed so that the optical axis coincides with a pixel center, whereas the imaging optical system (i, j) is disposed to be shifted by an amount corresponding to the distance to the imaging optical system (0, 0) so as to approach the imaging optical system (0, 0).

With this configuration, the respective pixels in the plurality of imaging regions can cover different imaging ranges. Moreover, by the reconstruction process, the demosaicing process, and the sharpening process similar to those of Embodiments 4 and 5, it is possible to acquire a multi-pixel and ultrahigh-resolution color image.

The arrangement of the imaging optical systems can be represented as an arrangement that a relative shift amount of each imaging optical system (i, j) in relation to the shift amount of the reference imaging optical system (0, 0) is directed toward the reference imaging optical system (0, 0) and the magnitude thereof has an amount corresponding to the distance from the reference imaging optical system (0, 0). The distance between imaging optical systems is the distance between optical axes. Although the reference imaging optical system is set to one of the imaging optical systems (the imaging optical systems (0, 0), (0, 1), (1, 0), and (1, 1)) located closest to the center of the lens unit in this example, the reference imaging optical system may be selected arbitrarily among 2M×2N imaging optical systems.

The arrangement of the imaging optical systems can be specified as follows. That is, in this arrangement, a difference in shift amount between imaging optical systems adjacent in the horizontal direction is 1/(2M) pixel in the horizontal direction, and a difference in shift amount between imaging optical systems adjacent in the vertical direction is 1/(2N) pixel in the vertical direction. A difference in shift amount between imaging optical systems adjacent in the diagonal direction is 1/(2M) pixel in the horizontal direction and is 1/(2N) pixel in the vertical direction.

As described above, although it is effective to shift the imaging optical systems so as to approach each other from the perspective of reduction of parallax, it is not always necessary to shift the imaging optical systems in this manner. The relative shift amount of each imaging optical system may be $-\frac{1}{2} \times Km/M$ in the horizontal direction and $-\frac{1}{2} \times Kn/N$ in the vertical direction with respect to the shift amount of any one imaging optical system, and all of the 2M×2N imaging optical systems may have different shift amounts. Here, $-M+1 \leq Km \leq M$ and $-N+1 \leq Kn \leq N$ are provided. As described above, in the present embodiment, since the parallax is sufficiently small, it is possible to acquire a multi-pixel and ultrahigh-resolution color image.

In the above-described example, although an imaging optical system (that is, an imaging optical system having a shift amount of zero) of which the optical axis coincides with the center of a reference pixel of a corresponding imaging region is present, such an imaging optical system may not be present. For example, the shift amount of the imaging optical system (i, j) may be set to $Dx-\frac{1}{2} \times Km/M$ in the horizontal direction and $Dy-\frac{1}{2} \times Kn/N$ in the vertical direction. Particularly, in an arrangement where $Dx=1/(2M)$ and $Dy=1/(2N)$, all imaging optical systems are shifted by an amount corresponding to the distance from the center (the center of the plurality of imaging optical systems) of the lens unit 11 in the direction toward the center.

In other words, not all imaging optical systems do not have to have mutually different shift amounts. At least some of 2M×2N imaging optical systems may be arranged with a different shift amount from that of the other imaging optical systems. However, a predetermined number or more of imaging optical systems among the 2M×2N imaging optical systems preferably have different shift amounts. The predetermined number may be, for example, 4, 8, the smallest integer of 50% or more of 2M×2N, the smallest integer of 80% or more of 2M×2N, or the smallest integer of 90% or more of 2M×2N. For example, a sufficiently high-resolution image is obtained if at least 14/16 (=87.5%) of all imaging

Other Embodiments

Embodiment(s) of the present invention can also be realized by a computer of a system or an apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or the apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and to execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), a digital versatile disc (DVD), or a Blu-ray Disc (BD)™), a flash memory device, a memory card, and the like.

The technique of the present disclosure can be ideally used in a color imaging apparatus having an electronic imaging device, and particularly, in a digital camera, a digital video camera, a cellular phone camera, a surveillance camera, a wearable camera, a medical camera, and the like. With the pixel shift of the present disclosure, the pseudo-resolution of a color imaging apparatus can be improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-149462, filed on Aug. 1, 2017, which is hereby incorporated by reference herein in its entirety.

What is claimed is:

1. An imaging apparatus comprising:
    a plurality of imaging optical systems arranged two-dimensionally; and
    an imaging device having a plurality of imaging regions, each including a plurality of pixels, and each of the imaging regions corresponding to one of the plurality of imaging optical systems,
    wherein the plurality of imaging optical systems are arranged such that (2M+1)×(2N+1) imaging optical systems are arranged two-dimensionally in a horizontal direction and a vertical direction, where M and N are integers of 1 or more,
    wherein color filters of a Bayer arrangement are arranged for each of the imaging regions,
    wherein the plurality of imaging optical systems include a reference imaging optical system, and
    wherein a difference between a shift amount of the reference imaging optical system and a shift amount of an imaging optical system other than the reference imaging optical system is 2×Km/(2M+1) pixels in a horizontal direction and 2×Kn/(2N+1) pixels in a vertical direction, where Km is an integer satisfying −M≤Km≤M, and Kn is an integer satisfying −N≤Kn≤N.

2. The imaging apparatus according to claim 1, wherein a predetermined number or more of the plurality of imaging optical systems have mutually different shift amounts.

3. The imaging apparatus according to claim 1, wherein all the plurality of imaging optical systems have mutually different shift amounts.

4. The imaging apparatus according to claim 3, wherein a color filter is provided for each of the pixels so that a Bayer arrangement is realized when respective pixels of the plurality of imaging regions are rearranged according to an angle of view of each of the pixels.

5. The imaging apparatus according to claim 1, wherein the reference imaging optical system is an imaging optical system at a center among the plurality of imaging optical systems.

6. The imaging apparatus according to claim 1, wherein the shift amount of the reference imaging optical system is zero.

7. The imaging apparatus according to claim 1, wherein the imaging optical systems other than the reference imaging optical system are shifted toward the reference imaging optical system by a shift amount that varies depending on respective distances from the reference imaging optical system.

8. The imaging apparatus according to claim 1, further comprising:
    a reconstruction processing unit that rearranges pixels of the plurality of imaging regions in an image acquired from the imaging device according to an angle of view to generate a reconstructed image having a greater number of pixels than the number of pixels in each imaging region; and
    a demosaicing processing unit that demosaices the reconstructed image to generate a color image.

9. The imaging apparatus according to claim 8, further comprising a sharpening processing unit that sharpens the color image.

10. The imaging apparatus according to claim 1, wherein the plurality of imaging optical systems are disposed on a same substrate.

11. The imaging apparatus according to claim 10, wherein a distance between adjacent imaging optical systems is 1 mm or less.

12. An imaging apparatus comprising:
    a plurality of imaging optical systems arranged two-dimensionally;
    an imaging device having a plurality of imaging regions each including a plurality of pixels, and each of the imaging regions corresponding to one of the plurality of imaging optical systems; and
    color filters of a Bayer arrangement,
    wherein the plurality of imaging optical systems are arranged such that 2M×2N imaging optical systems are arranged two-dimensionally in a horizontal direction and a vertical direction, where M and N are integers of 1 or more, wherein the plurality of pixels of one imaging region is associated with one or more of the color filters of a same color, wherein the plurality of imaging optical systems include a reference imaging optical system, and wherein a difference between a shift amount of the reference imaging optical system and a shift amount of an imaging optical system other than the reference imaging optical system is $½×Km/M$ pixels in a horizontal direction and $½×Kn/N$ pixels in a vertical direction, where Km is an integer satisfying $-M≤Km≤M$, and Kn is an integer satisfying $-N≤Kn≤N$.

13. The imaging apparatus according to claim 12, wherein the reference imaging optical system is an imaging optical system located closest to a center of the two-dimensionally arranged plurality of imaging optical systems.

14. The imaging apparatus according to claim 12, wherein the shift amount of the reference imaging optical system is zero.

15. The imaging apparatus according to claim 12, wherein the imaging optical systems other than the reference imaging optical system are shifted toward the reference imaging optical system by a shift amount that varies depending on respective distances from the reference imaging optical system.

16. The imaging apparatus according to claim 12, wherein each of the plurality of imaging optical systems is shifted in the direction toward a center of the imaging device and by an amount that varies depending on respective distance from the center.

17. The imaging apparatus according to claim 12, wherein each of the plurality of imaging optical systems is configured such that an optical performance in a wavelength corresponding to the color of a corresponding color filter is higher than that in the other wavelengths.

18. The imaging apparatus according to claim 12, further comprising:

a reconstruction processing unit that rearranges pixels of the plurality of imaging regions in an image acquired from the imaging device according to an angle of view to generate a reconstructed image having a greater number of pixels than the number of pixels in each imaging region; and a demosaicing processing unit that demosaices the reconstructed image to generate a color image.

19. The imaging apparatus according to claim 18, further comprising a sharpening processing unit that sharpens the color image.

20. The imaging apparatus according to claim 12, wherein the plurality of imaging optical systems are disposed on a same substrate.

21. The imaging apparatus according to claim 20, wherein a distance between adjacent imaging optical systems is 1 mm or less.

* * * * *